US011050405B2

(12) United States Patent
Gorman et al.

(10) Patent No.: US 11,050,405 B2
(45) Date of Patent: Jun. 29, 2021

(54) MICROMECHANICAL VIBRASOLATOR

(71) Applicant: Government of the United States of America, as represented by the Secretary of Commerce, Gaithersburg, MD (US)

(72) Inventors: Jason J. Gorman, Silver Spring, MD (US); Vikrant J. Gokhale, Gaithersburg, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 153 days.

(21) Appl. No.: 16/376,533

(22) Filed: Apr. 5, 2019

(65) Prior Publication Data

US 2019/0267965 A1 Aug. 29, 2019

Related U.S. Application Data

(60) Provisional application No. 62/617,766, filed on Jan. 16, 2018.

(51) Int. Cl.
*H03H 9/02* (2006.01)
*H03H 9/24* (2006.01)
(52) U.S. Cl.
CPC ...... *H03H 9/02433* (2013.01); *H03H 9/2452* (2013.01); *H03H 2009/0244* (2013.01)

(58) Field of Classification Search
CPC ............ H03H 9/02433; H03H 9/2452; H03H 2009/0244; H03H 2009/02496;
(Continued)

(56) References Cited

U.S. PATENT DOCUMENTS 7,586,239 B1 * 9/2009 Li .................... H03H 3/0072
310/323.02
8,624,471 B1 1/2014 Ayazi et al.
(Continued)

OTHER PUBLICATIONS

L. Sorenson, et al., "One-dimensional linear acoustic bandgap structures for performance enhancement of AlN-on-Silicon micromechanical resonators", IEEE (Transducers' 11), 2011, p. 918-921.
(Continued)

*Primary Examiner* — Ahmed Elnakib
(74) *Attorney, Agent, or Firm* — Office of Chief Counsel for National Institute of Standards and Technology

(57) ABSTRACT

A micromechanical vibrasolator isolates vibration of a micromechanical resonator and includes: phononic bandgap mirrors, monophones connected serially; phonophore arms in an alternating sequence of phonophore arm-monophone-phonophore arm; abutments in acoustic communication with the phononic bandgap mirrors; wherein the micromechanical resonator is interposed between the phononic bandgap mirrors with phononic bandgap mirror arranged in parallel on opposing sides of the micromechanical resonator arranged perpendicular to a direction of vibration of an in-plane vibrational mode of the micromechanical resonator.

18 Claims, 29 Drawing Sheets

(58) Field of Classification Search
CPC ......... H03H 9/02338; H03H 2009/155; H03H 9/02228; H03B 5/30
USPC ... 310/309, 308, 313 R, 321, 353, 351, 346, 310/324; 331/154, 116 M
See application file for complete search history.

(56) References Cited

U.S. PATENT DOCUMENTS

| | | | | |
|---|---|---|---|---|
| 8,786,166 | B2* | 7/2014 | Jaakkola | H03H 3/0076 310/353 |
| 9,954,513 | B1* | 4/2018 | Thalmayr | H03B 5/30 |
| 2006/0261915 | A1* | 11/2006 | Lutz | H03H 9/02448 333/186 |
| 2010/0182102 | A1* | 7/2010 | Kuypers | H03H 9/02834 333/197 |
| 2019/0267965 | A1* | 8/2019 | Gorman | H03H 9/2452 |

OTHER PUBLICATIONS

C-M. Lin, et al., "Anchor loss reduction in ALN Lamb wave resonators using phononic crystal strip tethers", IEEE International Frequency Control Symposium (FCS), 2014.

H. Zhu, et al., "AlN piezoelectric on silicon MEMS resonator with boosted Q using planar patterned phononic crystals on anchors", IEEE International Conference on Micro Electro Mechanical Systems (MEMS), 2015, p. 797-800.

H. Zhu, et al., "Design of Phononic Crystal Tethers for Frequency-selective Quality Factor Enhancement n AlN Piezoelectric-on-silicon Resonators", Procedia Engineering, 2015, p. 516-519, vol. 120.

* cited by examiner (A)

(B) Cross-section along line A-A in panel A (C) Cross-section along line B-B in panel A (A) 230

(B) 230

(C) 230

(D) 230

| WE-BAR Specifications | | | | |
|---|---|---|---|---|
| Group | $w$ (μm) | $l$ (μm) | Expected Frequency (MHz) | Measured Frequency (MHz) |
| A | 25.5 | 80 | 162 | 167.06 ± 0.09 |
| B | 18.5 | 75 | 224 | 227.61 ± 0.17 |
| C | 14.5 | 65 | 286 | 281.86 ± 0.40 |

| PnC Tether Specifications | | | | |
|---|---|---|---|---|
| Group | $a$ (μm) | $b$ (μm) | $(a-b)/2$ (μm) | $c$ (μm) | Bandgap (MHz) |
| A | 20 | 10 | 5 | 2 | 149 – 188 |
| B | 10 | 9 | 0.5 | 1 | 156 – 264 |
| C | 10 | 9 | 0.5 | 2 | 209 – 279 |

Figure 12

MICROMECHANICAL VIBRASOLATOR

CROSS REFERENCE TO RELATED APPLICATIONS

The application claims priority to U.S. Provisional Patent Application Ser. No. 62/617,766 filed Jan. 16, 2018, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce and under Agreement No. 70NANB14H253 and 70NANB16H307 awarded by NIST, U.S. Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 18-014US1.

BRIEF DESCRIPTION

A micromechanical vibrasolator isolates vibration of a micromechanical resonator and includes: phononic bandgap mirrors, monophones connected serially; phonophore arms in an alternating sequence of phonophore arm-monophone-phonophore arm; abutments in acoustic communication with the phononic bandgap mirrors; wherein the micromechanical resonator is interposed between the phononic bandgap mirrors with phononic bandgap mirror arranged in parallel on opposing sides of the micromechanical resonator arranged perpendicular to a direction of vibration of an in-plane vibrational mode of the micromechanical resonator.

Disclosed is a micromechanical vibrasolator to isolate vibration of a micromechanical resonator, the micromechanical vibrasolator comprising: the micromechanical resonator comprising a vibrational resonance frequency and in-plane vibrational mode at the vibrational resonance frequency; a first phononic bandgap mirror in acoustic communication with the micromechanical resonator and disposed on the micromechanical resonator, the first phononic bandgap mirror comprising: a plurality of monophones, each monophone being connected serially in acoustic communication with an adjacent monophone; and a plurality of phonophore arms in acoustic communication with the monophones, such that adjacent monophones are interconnected by a phonophore arm and interposed between a pair of phonophore arms to provide an alternating sequence of phonophore arm-monophone-phonophore arm, the alternating pattern being repeated a plurality of times in the first phononic bandgap mirror to provide a first acoustic bandgap at the vibrational resonance frequency of the micromechanical resonator, such that the first phononic bandgap mirror is disposed on the micromechanical resonator by at least one of the phonophore arms; a first abutment in acoustic communication with the first phononic bandgap mirror and disposed on the first phononic bandgap mirror, the first phononic bandgap mirror being interposed between the first abutment and the micromechanical resonator such that the vibrational resonance frequency from the micromechanical resonator is blocked from being received by the first abutment by the first acoustic bandgap of the first phononic bandgap mirror; a second phononic bandgap mirror in acoustic communication with the micromechanical resonator and disposed on the micromechanical resonator, the second phononic bandgap mirror comprising: a plurality of monophones, each monophone being connected serially in acoustic communication with an adjacent monophone; and a plurality of phonophore arms in acoustic communication with the monophones, such that adjacent monophones are interconnected by a phonophore arm and interposed between a pair of phonophore arms to provide an alternating pattern of phonophore arm-monophone-phonophore arm, the alternating pattern being repeated a plurality of times in the second phononic bandgap mirror to provide a second acoustic bandgap, such that the second phononic bandgap mirror is disposed on the micromechanical resonator by at least one of the phonophore arms in the second phononic bandgap mirror; and a second abutment in acoustic communication with the second phononic bandgap mirror and disposed on the second phononic bandgap mirror, the second phononic bandgap mirror being interposed between the second abutment and the micromechanical resonator such that the vibrational resonance frequency from the micromechanical resonator is blocked from being received by the second abutment by the second acoustic bandgap of the second phononic bandgap mirror; wherein the micromechanical resonator is interposed between the first phononic bandgap mirror and the second phononic bandgap mirror; the first phononic bandgap mirror is arranged parallel to the second phononic bandgap mirror on opposing sides of the micromechanical resonator, and the first phononic bandgap mirror and second phononic bandgap mirror are arranged perpendicular to a direction of vibration of the in-plane vibrational mode of the micromechanical resonator.

BRIEF DESCRIPTION OF THE DRAWINGS

The following description should not be considered limiting in any way. With reference to the accompanying drawings, like elements are numbered alike.

FIG. 12 shows a table that lists specifications for exemplary resonator and phononic tethers;

DETAILED DESCRIPTION

A detailed description of one or more embodiments is presented herein by way of exemplification and not limitation.

It has been discovered that a micromechanical vibrasolator increases the quality factor of a micromechanical resonator. Phononic crystals tether the micromechanical resonator to a substrate and provide acoustic mirrors that confine acoustic energy in the micromechanical resonator. Unexpectedly and advantageously, the micromechanical vibrasolator has a three-fold improvement in quality factor over conventional isolation systems in an absence of energy dissipation through the tethers. Moreover, the micromechanical vibrasolator overcomes limitations with conventional resonator supports that include simple narrow beams that result in significant acoustic energy loss through those beams and a low quality factor (Q factor). Beneficially, the micromechanical vibrasolator stops acoustic energy from leaving the micromechanical resonator and has a higher quality factor than conventional systems.

Micromechanical resonators are widely used for frequency control, signal processing, and sensing and are found in silicon clocks, radio frequency filters, and gyroscopes. A performance metric for micromechanical resonators is the quality factor, which is a measure of the rate of energy dissipation. Resonators with high quality factor are desirable because silicon clocks will be more stable, radio frequency filters will have narrower pass bands, and gyroscopes will have greater sensitivity. While there are many sources of energy dissipation, a dominant source is tether, or anchor, loss, where vibrational energy is transmitted through the anchors that support the resonator. That is, local storage of energy in a conventional mechanical resonator is limited by leakage of energy away from the mechanical resonator to surrounding structures that are in mechanical communication with the mechanical resonator. Such leakage can lower the quality factor of a conventional mechanical resonator. The micromechanical vibrasolator overcomes anchor loss by confining vibrational energy in the resonator using tethers that confine energy in the resonator using periodic structures that act as acoustic mirrors.

Figure 1:
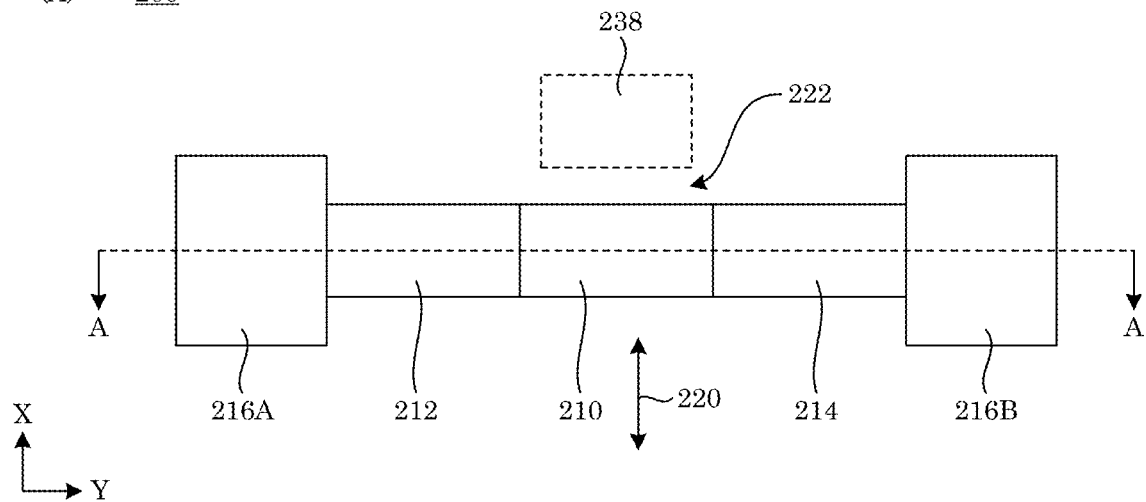
FIG. 1 shows a top view of a micromechanical vibrasolator 200 in panel A, and panel B shows a cross-section along line A-A shown in panel A.
Figure 1:
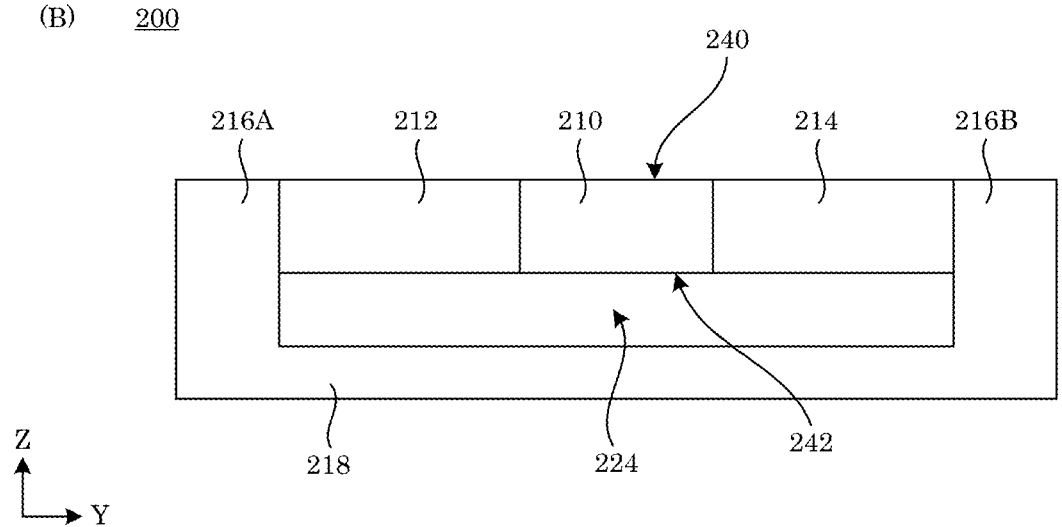

Micromechanical vibrasolator 200 provides vibrational isolation of micromechanical resonator 210 from mechanically connected structures such as abutments, substrates, and the like. In an embodiment, with reference to FIG. 1, micromechanical vibrasolator 200 includes micromechanical resonator 210 in mechanical communication with and interposed between first phononic bandgap mirror 212 and second phononic bandgap mirror 214. First phononic bandgap mirror 212 is in mechanical communication with and interposed between micromechanical resonator 210 and first abutment 216A to vibrationally isolate micromechanical resonator 210 from first abutment 216A, and second phononic bandgap mirror 214 is in mechanical communication with and interposed between micromechanical resonator 210 and second abutment 216B to vibrationally isolate micromechanical resonator 210 from second abutment 216B. That is, micromechanical resonator 210 can be disposed proximate to actuator 238 and separated from actuator 238 by actuation gap 222. Micromechanical resonator 210 is electrostatically coupled to actuator 238 so that actuator 238 subjects micromechanical resonator 210 to an electrostatic force that moves micromechanical resonator 210 along direction of vibration 220 in response to electrostatic repulsion or electrostatic attraction between actuator 238 and micromechanical resonator 210. Motion of micromechanical resonator 210 along direction of vibration 220 is vibration of micromechanical resonator 210 in direction of vibration 220. The vibration of micromechanical resonator 210 in direction of vibration 220 can occur at a vibrational resonance frequency for micromechanical resonator 210 with an in-plane vibrational mode at the vibrational resonance frequency. First phononic bandgap mirror 212 and second phononic bandgap mirror 214 block acoustic transmission of the vibration of micromechanical resonator 210 from first abutment 216A and second abutment 216B. First abutment 216A and second abutment 216B are disposed on substrate 218 and support micromechanical resonator 210 from substrate 218 at resonator gap 224. In this manner, substrate 218 is acoustically isolated from vibration of micromechanical resonator 210 by first phononic bandgap mirror 212 and second phononic bandgap mirror 214. It should be appreciated that first phononic bandgap mirror 212 and second phononic bandgap mirror 214 are arranged perpendicular to direction of vibration 220 of the in-plane vibrational mode of micromechanical resonator 210.

Figure 2:
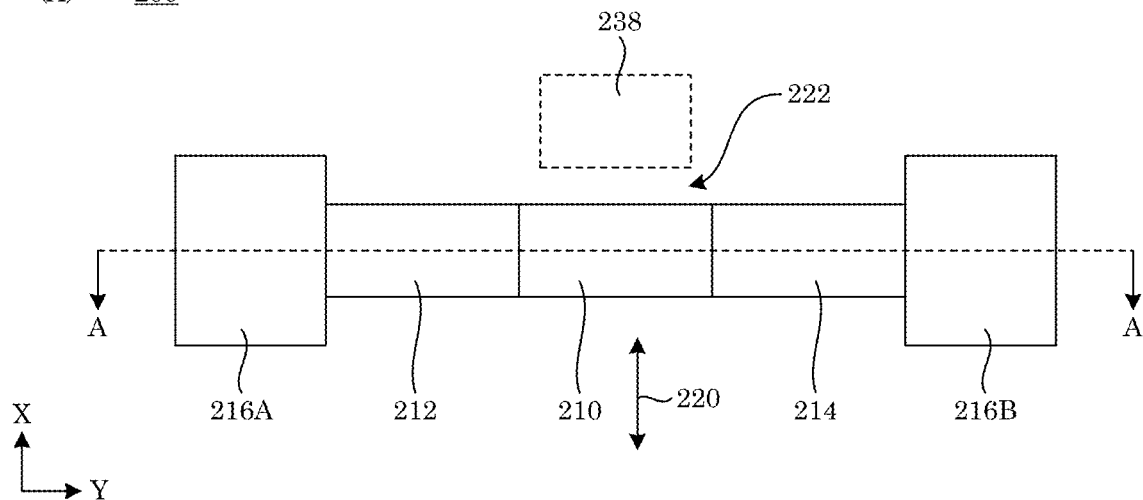
FIG. 2 shows a top view of a micromechanical vibrasolator 200 in panel A, and panel B shows a cross-section along line A-A shown in panel A.
Figure 2:
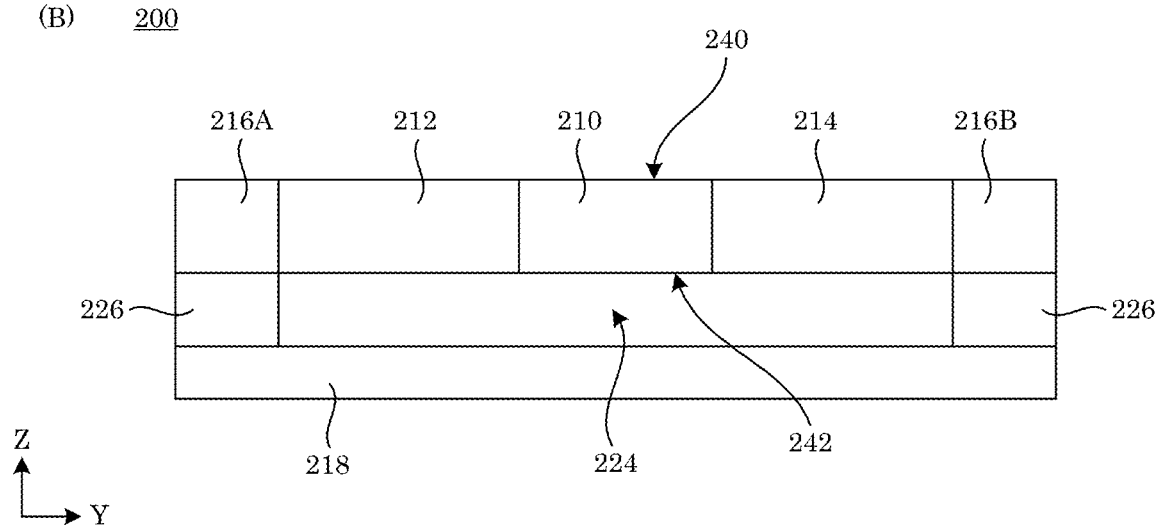

In an embodiment, with reference to FIG. 2, support 226 is disposed on substrate 218 and interposed between substrate 218 and each abutment 216.

Figure 3:
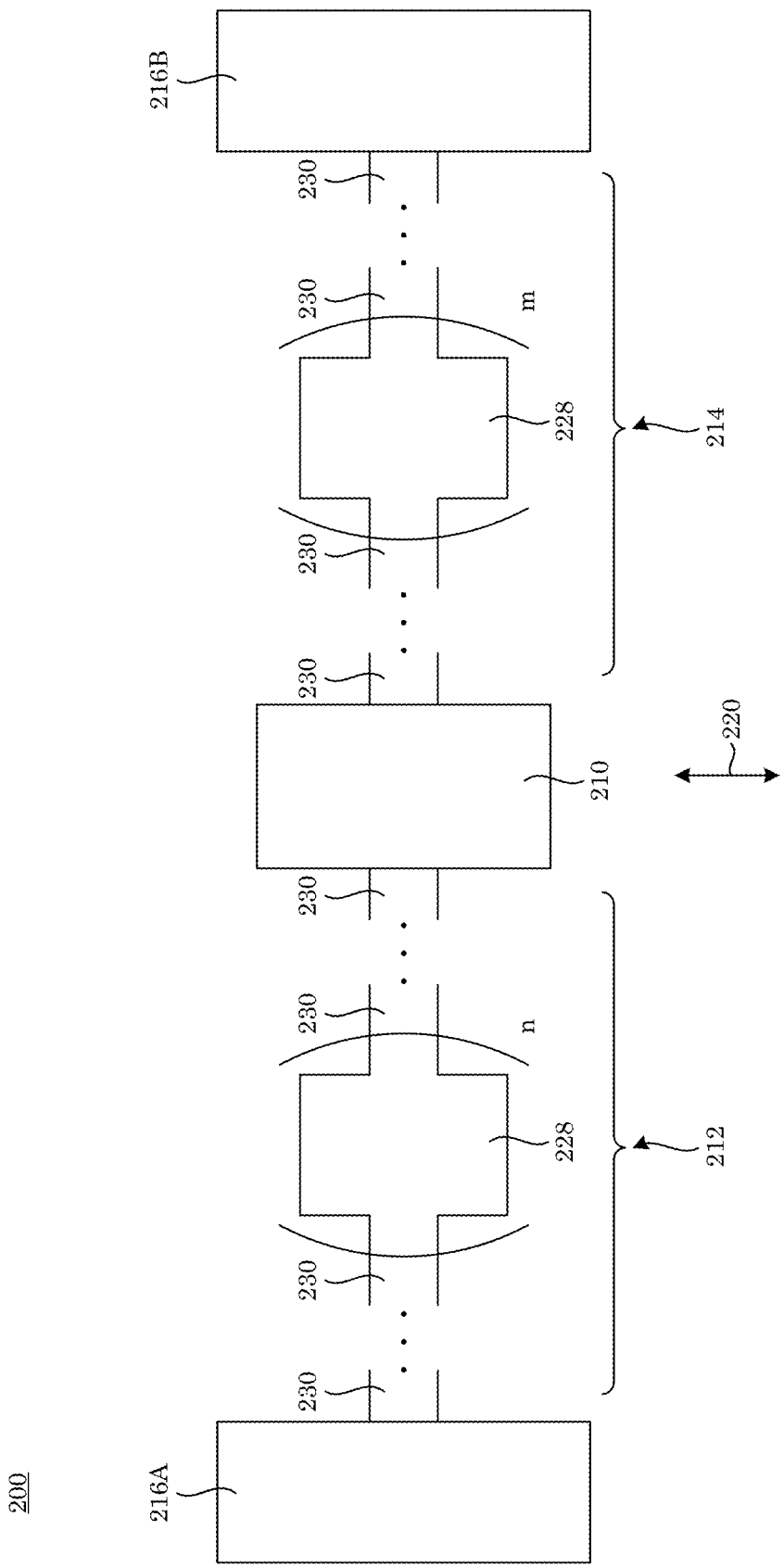
FIG. 3 shows a top view of a micromechanical vibrasolator 200.
Figure 4:
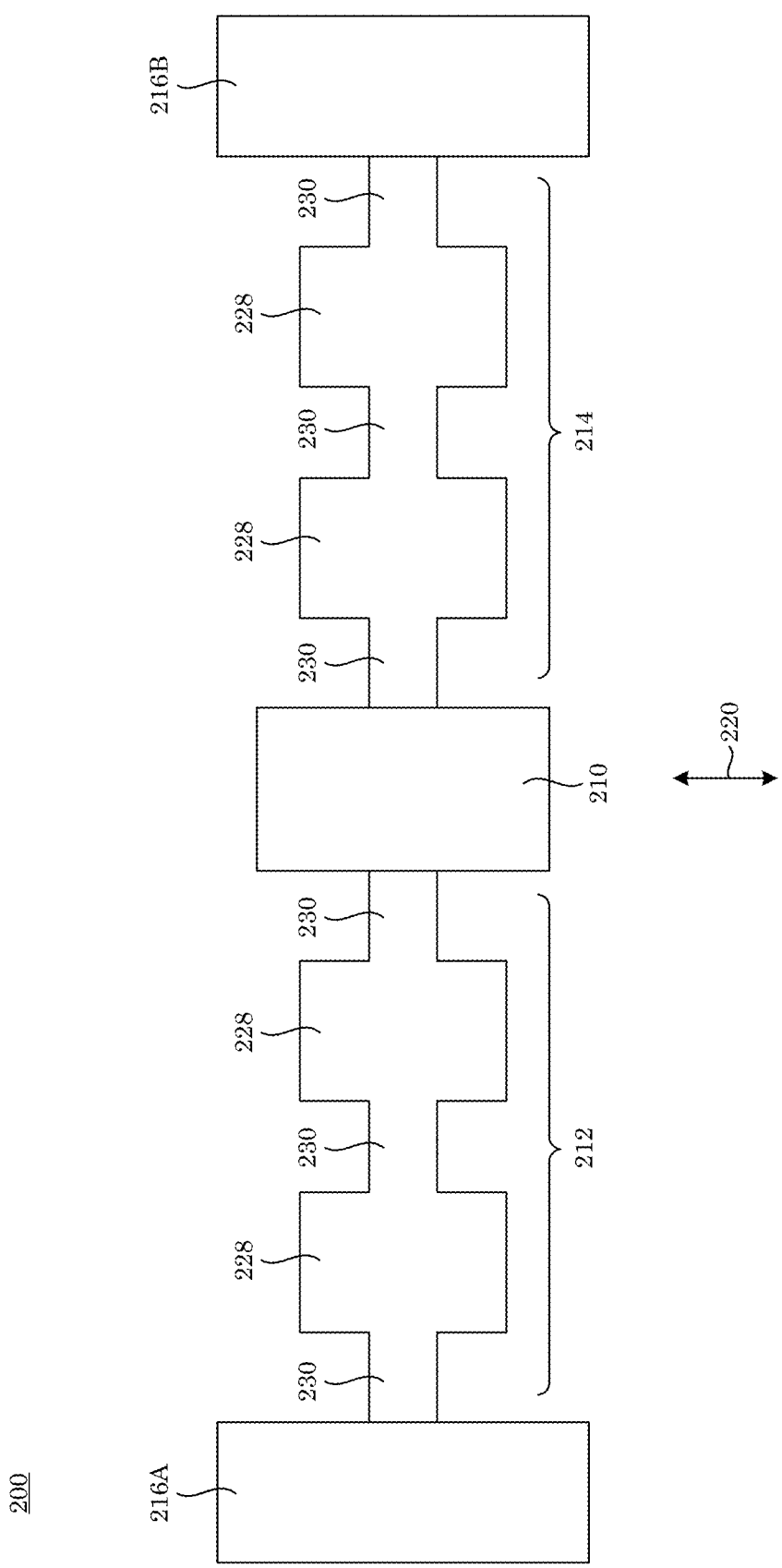
FIG. 4 shows a top view of a micromechanical vibrasolator 200.
Figure 5:
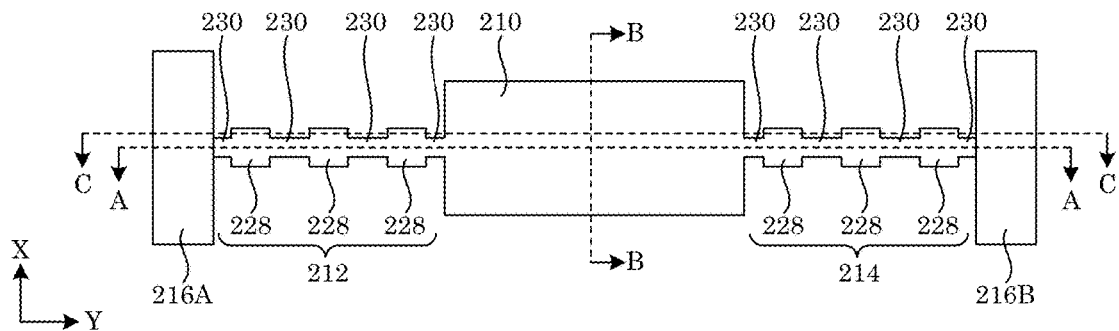
FIG. 5 shows a top view of a micromechanical vibrasolator 200 in panel A; panel B shows a cross-section along line A-A shown in panel A; panel C shows a cross-section along line B-B shown in panel A; and panel D shows a cross-section along line C-C shown in panel A.
Figure 5:
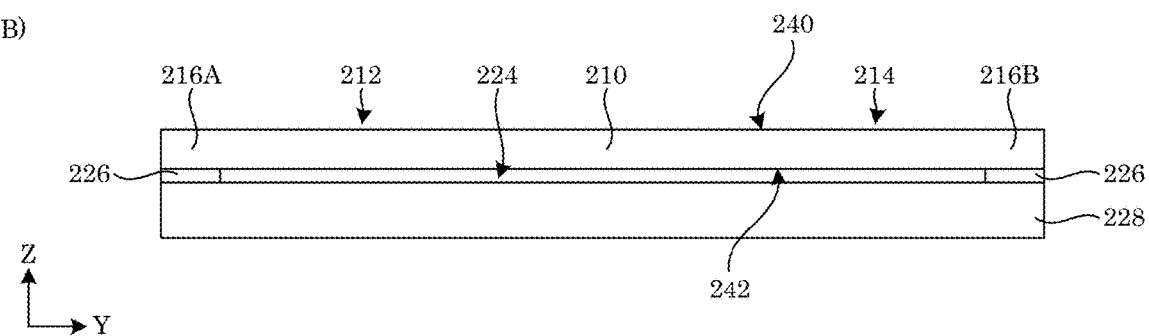
Figure 5:
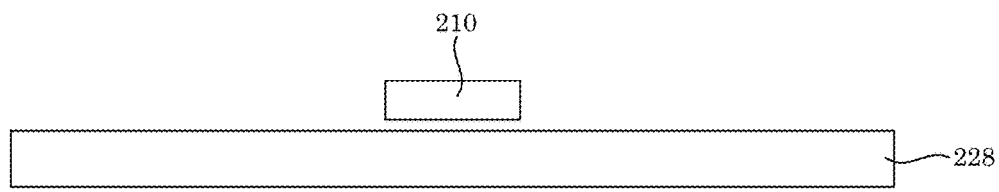
Figure 5:
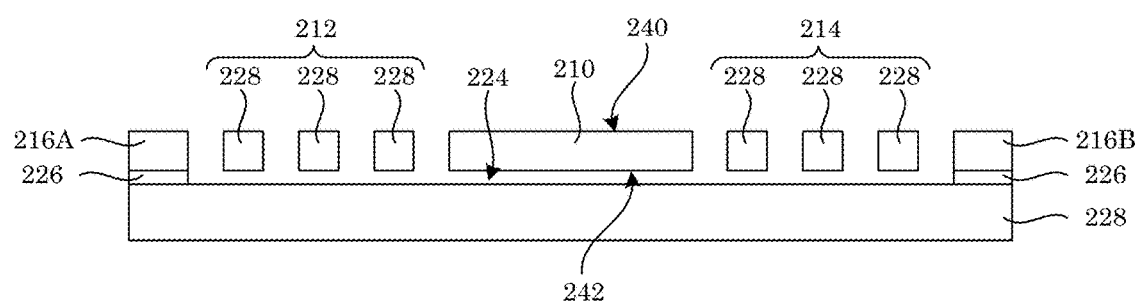

In an embodiment, with reference to FIG. 3, FIG. 4, and FIG. 5, micromechanical vibrasolator 200 isolates vibration of micromechanical resonator 210 and includes: micromechanical resonator 210. Micromechanical resonator 210 includes a vibrational resonance frequency and in-plane vibrational mode at the vibrational resonance frequency. First phononic bandgap mirror 212 is in acoustic communication with micromechanical resonator 210 and disposed on micromechanical resonator 210. First phononic bandgap mirror 212 includes a plurality of monophones 228, wherein each monophone 228 is connected serially in acoustic communication with an adjacent monophone 228; and a plurality of phonophore arms 230 in acoustic communication with monophones 228, such that adjacent monophones 228 are interconnected by phonophore arm 230 and interposed between a pair of phonophore arms 230 to provide an alternating sequence of phonophore arm 230-monophone 228-phonophore arm 230, the alternating sequence being repeated a plurality of times in first phononic bandgap mirror 212 and providing a first acoustic bandgap at the vibrational resonance frequency of the micromechanical resonator 210, such that first phononic bandgap mirror 212 is disposed on micromechanical resonator 210 by at least one of phonophore arms 230. First abutment 216A is in acoustic communication with first phononic bandgap mirror 212 and disposed on first phononic bandgap mirror 212 with first phononic bandgap mirror 212 interposed between first abutment 216A and micromechanical resonator 210 such that vibrational resonance frequency from micromechanical resonator 210 is blocked from being received by first abutment 216A by first acoustic bandgap of first phononic bandgap mirror 212. Moreover, second phononic bandgap mirror 214 is in acoustic communication with micromechanical resonator 210 and disposed on micromechanical resonator 210. Second phononic bandgap mirror 214 includes: a plurality of monophones 228, each monophone 228 being connected serially in acoustic communication with an adjacent monophone 228; and a plurality of phonophore arms 230 in acoustic communication with monophones 228, such that adjacent monophones 228 are interconnected by phonophore arm 230 and interposed between a pair of phonophore arms 230 to provide an alternating sequence of phonophore arm 230-monophone 228-phonophore arm 230, the alternating sequence being repeated a plurality of times in second phononic bandgap mirror 214 to provide a second acoustic bandgap, such that second phononic bandgap mirror 214 is disposed on micromechanical resonator 210 by at least one of phonophore arms 230 in second phononic bandgap mirror 214. Second abutment 216B is in acoustic communication with second phononic bandgap mirror 214 and disposed on second phononic bandgap mirror 214, second phononic bandgap mirror 214 being interposed between second abutment 216B and micromechanical resonator 210 such that the vibrational resonance frequency from micromechanical resonator 210 is blocked from being received by second abutment 216B by second acoustic bandgap of second phononic bandgap mirror 214. Micromechanical resonator 210 is interposed between first phononic bandgap mirror 212 and second phononic bandgap mirror 214, and first phononic bandgap mirror 212 is arranged parallel to second phononic bandgap mirror 214 on opposing sides of micromechanical resonator 210. Here, first phononic bandgap mirror 212 and second phononic bandgap mirror 214 are arranged perpendicular to direction of vibration 220 of the in-plane vibrational mode of micromechanical resonator 210.

Figure 6:
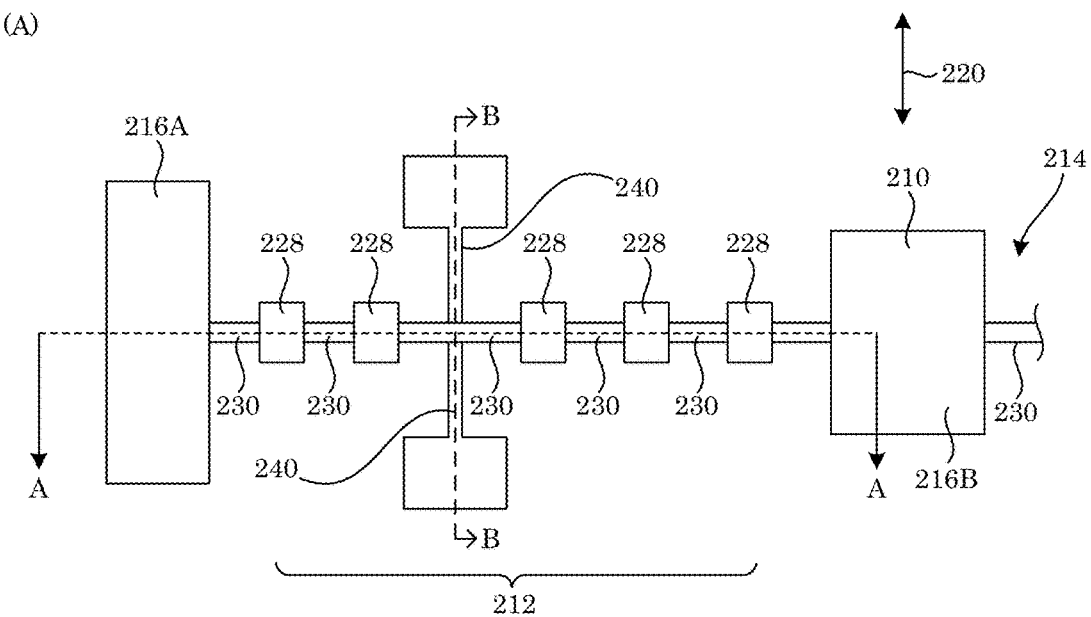
FIG. 6 shows a top view of a micromechanical vibrasolator 200 in panel A, and panel B shows a cross-section along line A-A shown in panel A.
Figure 6:
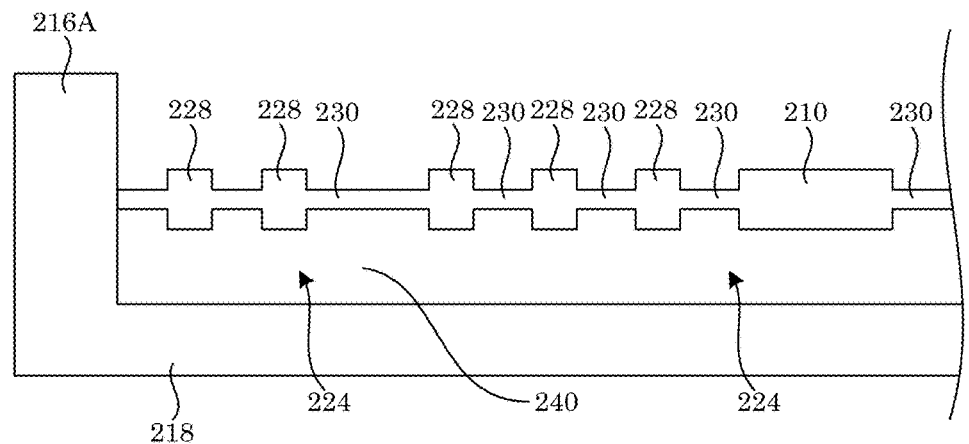
Figure 6:
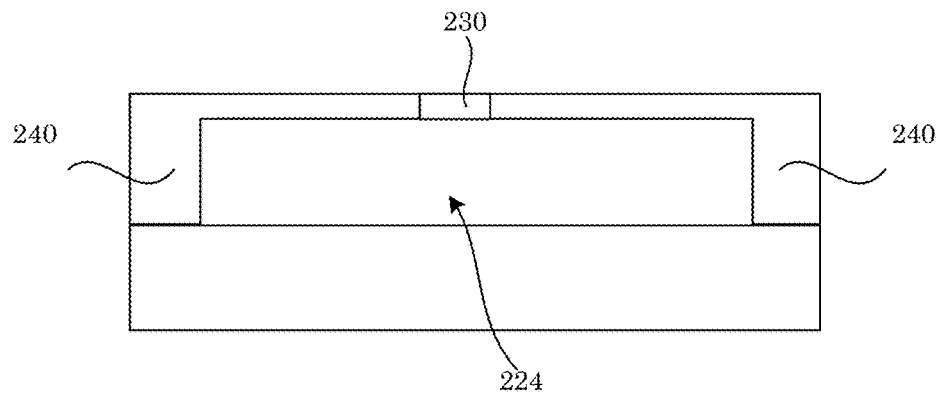

In an embodiment, with reference to FIG. 6, micromechanical vibrasolator 200 further includes substrate 218 on which first abutment 216A and second abutment 216B are disposed; and resonator gap 224 interposed between substrate 218 and first phononic bandgap mirror 212, micromechanical resonator 210, and second phononic bandgap mirror 214 such that micromechanical resonator 210 is spaced apart from substrate 218 by resonator gap 224. First abutment 216A and second abutment 216B suspend first phononic bandgap mirror 212, micromechanical resonator 210, and second phononic bandgap mirror 214 off of substrate 218 by resonator gap 224. It is contemplated that micromechanical vibrasolator 200 can include junction support 240 disposed on substrate 218, wherein junction support 240 is interposed between first abutment 216A and substrate 218, and junction support 240 is interposed between second abutment 216B and substrate 8. According to an embodiment, micromechanical vibrasolator 200 includes actuator 228 in electrostatic communication with micromechanical resonator 210, Actuator 228 electrostatically interacts with micromechanical resonator 210 and electrostatically excites vibrational resonance frequency of micromechanical resonator 210 such that micromechanical resonator 210 vibrates in in-plane vibrational mode. Junction support 240 can increase lateral stiffness of the phononic bandgap mirror when a plurality of monophones and phonophores are used to maximize the reflectivity of the mirror.

In an embodiment, with reference to FIG. 6, micromechanical vibrasolator 200 includes junction support 240 disposed on substrate 218 and interposed between substrate 218 and first phononic bandgap mirror 212, or second phononic bandgap mirror 214. Junction support 240 supports first phononic bandgap mirror 212, or second phononic bandgap mirror 214. from substrate 218 so that resonator gap 224 separates substrate 218 therefrom, In an embodiment, with reference to FIG. 3, a number n of monophones 228 in first phononic bandgap mirror 212 is identical to a number m of monophones 228 in second phononic bandgap mirror 214. In some embodiments, the number n of monophones 228 in first phononic bandgap mirror 212 is different than the number m of monophones 228 in second phononic bandgap mirror 214, e.g., as shown in FIG. 4 and FIG. 5.

In micromechanical vibrasolator 200, micromechanical resonator 210 vibrates at the vibrational resonance frequency in response to being subjected to the electrostatic force from actuator 238. In an embodiment, micromechanical resonator 210 includes a structural body that vibrates, a structure that connects the body to the substrate, otherwise referred to as a tether, a method to actuate vibrations in the body, and a method for measuring the vibrations. Micromechanical resonator 210 can include flexural, width extensional, length extensional, contour mode, and Lame mode resonators with a body that can be in the shape of a square, rectangle, or circle. The micromechanical resonator can be composed of silicon, silicon dioxide, silicon nitride, silicon carbide, aluminum nitride, gallium nitride, or a metal and can be actuated using electrostatic force, electrothermal force, electromagnetic force, dielectric force, piezoelectric effect, photothermal effect, or radiation pressure. The vibrational resonance frequency can be from 500 kHz to 1 GHz, specifically from 1 MHz to 500 MHz, and more specifically from 50 MHz to 300 MHz. Moreover, a displacement amplitude of micromechanical resonator 210 at the vibrational resonance frequency an in direction of vibration 220 can be from 1 fm to 100 nm, specifically from 100 fm to 1 nm, and more specifically from 1 pm to 100 pm.

Figure 7:
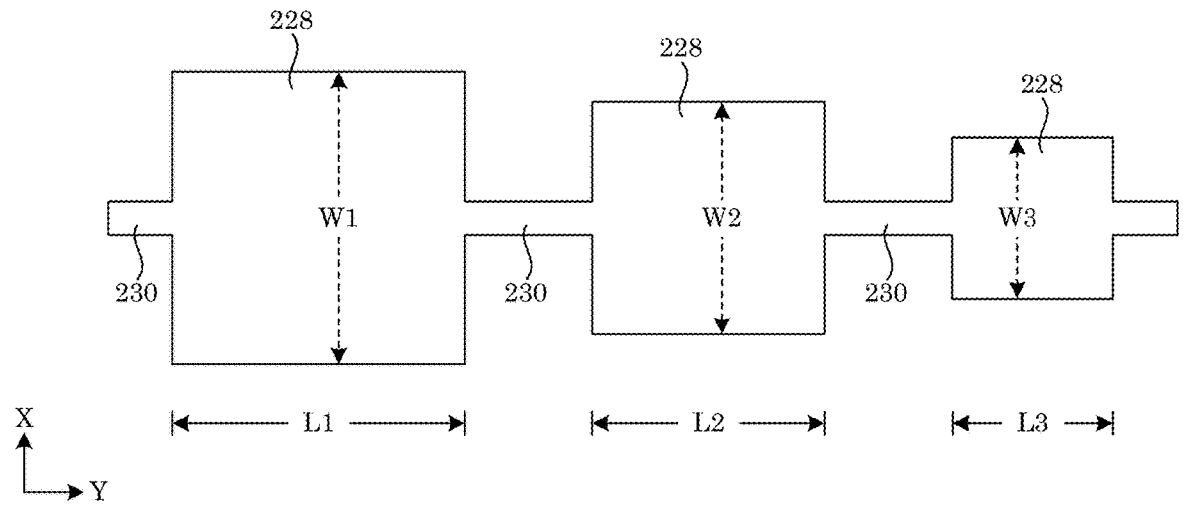
FIG. 7 shows a top view of a micromechanical vibrasolator 200 in panel A, and a top view of a micromechanical vibrasolator 200 in panel B.
Figure 7:
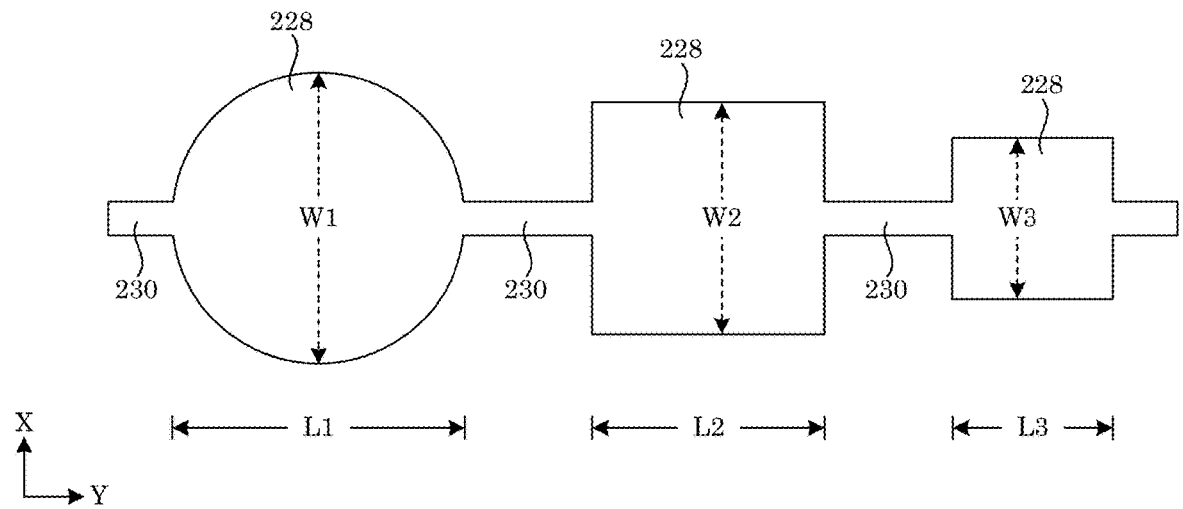
Figure 8:
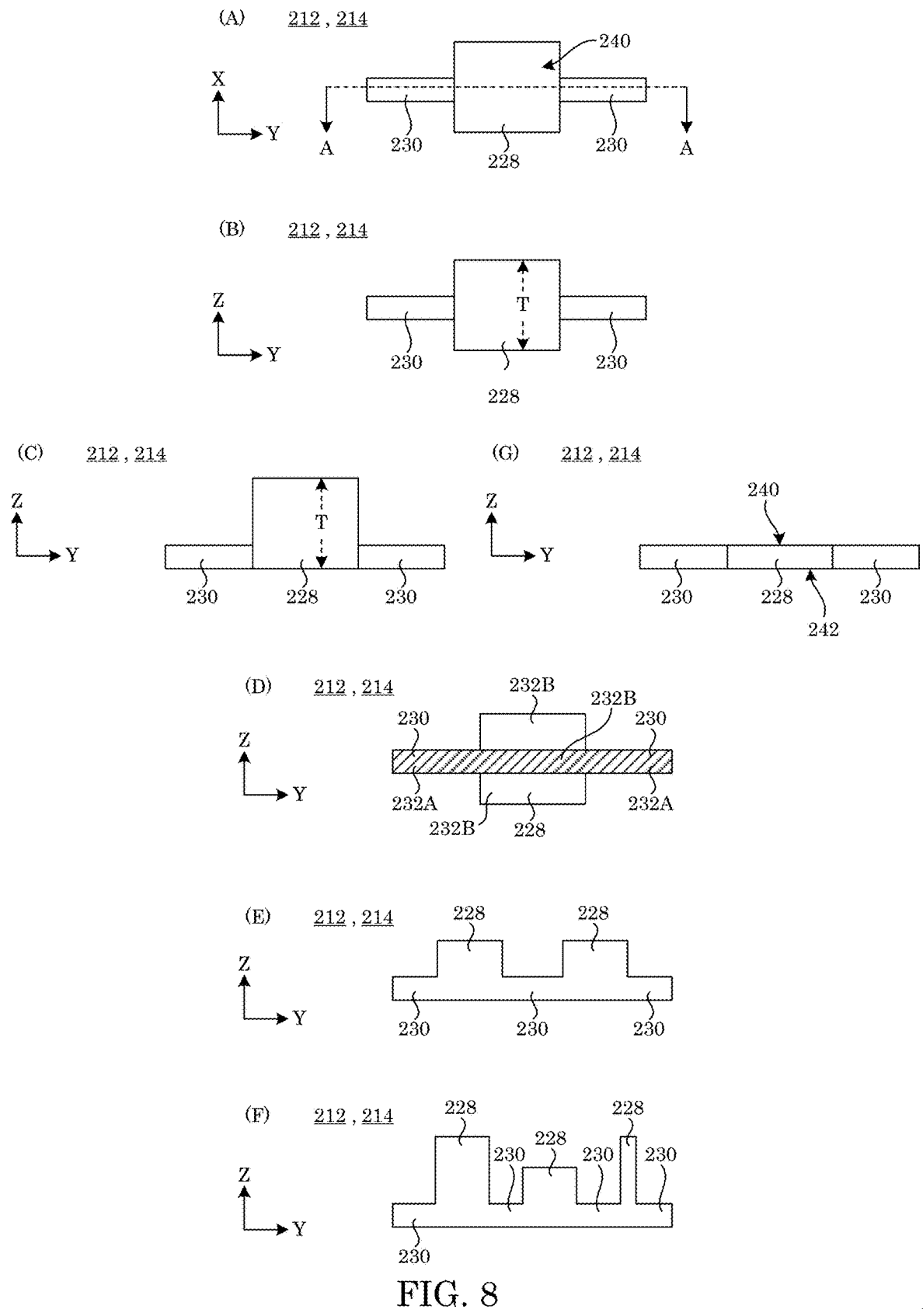
FIG. 8 shows a top view of a micromechanical vibrasolator 200 in panel A; panel B shows a cross-section along line A-A shown in panel A of the micromechanical vibrasolator 200; panel C shows a cross-section along line A-A shown in panel A of the micromechanical vibrasolator 200; panel D shows a cross-section along line A-A shown in panel A of the micromechanical vibrasolator 200; panel E shows a cross-section along line A-A shown in panel A of the micromechanical vibrasolator 200; and panel F shows a cross-section along line A-A shown in panel A of the micromechanical vibrasolator 200.

Monophone 228 in combination with phonophore arm 230 acoustically isolates micromechanical resonator 210 from abutment 216 and substrate 218. Monophone 228 can be composed of silicon, silicon dioxide, silicon nitride, silicon carbide, aluminum nitride, gallium nitride, or a metal, where the material is selected to achieve a desired acoustic velocity or acoustic impedance. In an embodiment, monophone 228 includes a mechanical element that can reflect acoustic waves, such as a square with dimensions tuned to the desired acoustic reflection. A volumetric size of monophone 228 can be from 0.125 $\mu m^3$ to 1 $mm^3$, specifically from 1 $\mu m^3$ to 0.001 $mm^3$, and more specifically from 125 $\mu m^3$ to 15000 $\mu m^3$. With reference to FIG. 7 and FIG. 8, monophone 228 has length L, width W, and thickness T orthogonal to length L and width W that independently can be from 0.5 $\mu m$ to 1 mm, specifically from 1 $\mu m$ to 100 $\mu m$, and more specifically from 5 $\mu m$ to 25 Monophones 228 in bandgap mirror (212 or 214) can have identical lengths or widths as shown in FIG. 4. In an embodiment, monophones 228 in bandgap mirror (212 or 214) have different lengths (e.g., different first length L1, second length L2, or third length L3) or widths (e.g., different first width W1, second width W2, or third width W3) as shown in FIG. 7 or thickness T as shown in panel F of FIG. 8.

Monophones 228 in bandgap mirror (212 or 214) can have identical cross-sectional shapes or different shapes. In an embodiment, at least one of monophones 228 in phononic bandgap mirror (212 or 214) has a cross-sectional shape that is different than at least one of a remainder of monophones 228 in phononic bandgap mirror (212 or 214). In an embodiment, monophones 228 in first phononic bandgap mirror 212 have identical cross-sectional shapes as the monophones in second phononic bandgap mirror 214. A cross-sectional shape of monophones 228 in phononic bandgap mirror (212 or 214) in a plane parallel to in-plane vibrational mode of micromechanical resonator 210 is a polygon, a circle, or an ellipse. In an embodiment, the cross-sectional shape is the polygon, and the polygon comprises a square. According to an embodiment, the shape of monophones 228 in first phononic bandgap mirror 212 and the shape of monophones 228 in second phononic bandgap mirror 214 are a cube.

With reference to FIG. 8, monophone 228 can be interposed between phonophore arms 230. In an embodiment, as shown in panel G of FIG. 8, monophone 228 and phonophore arm 230 have a same thickness T so that free surface 240 of monophone 228 is planar with phonophore arm 230, and gap surface 242 of monophone 228 is planar with phonophore arm 230. It should be appreciated that gap surface 242 opposes substrate 218 in micromechanical vibrasolator 200. In an embodiment, as shown in panels B, C, D, E, and F of FIG. 8, monophone 228 has thickness T that is different than a thickness of phonophore arm 230 so that free surface 240 or gap surface 242 is not planar with phonophore arm 230. As shown in panel D of FIG. 8, monophone 228 and phonophore 230 can be composed of different materials through their thickness. As shown in panel F of FIG. 8, a plurality of monophones 228 can be included in micromechanical vibrasolator 200 with different widths W, lengths L, or thicknesses T.

Figure 9:
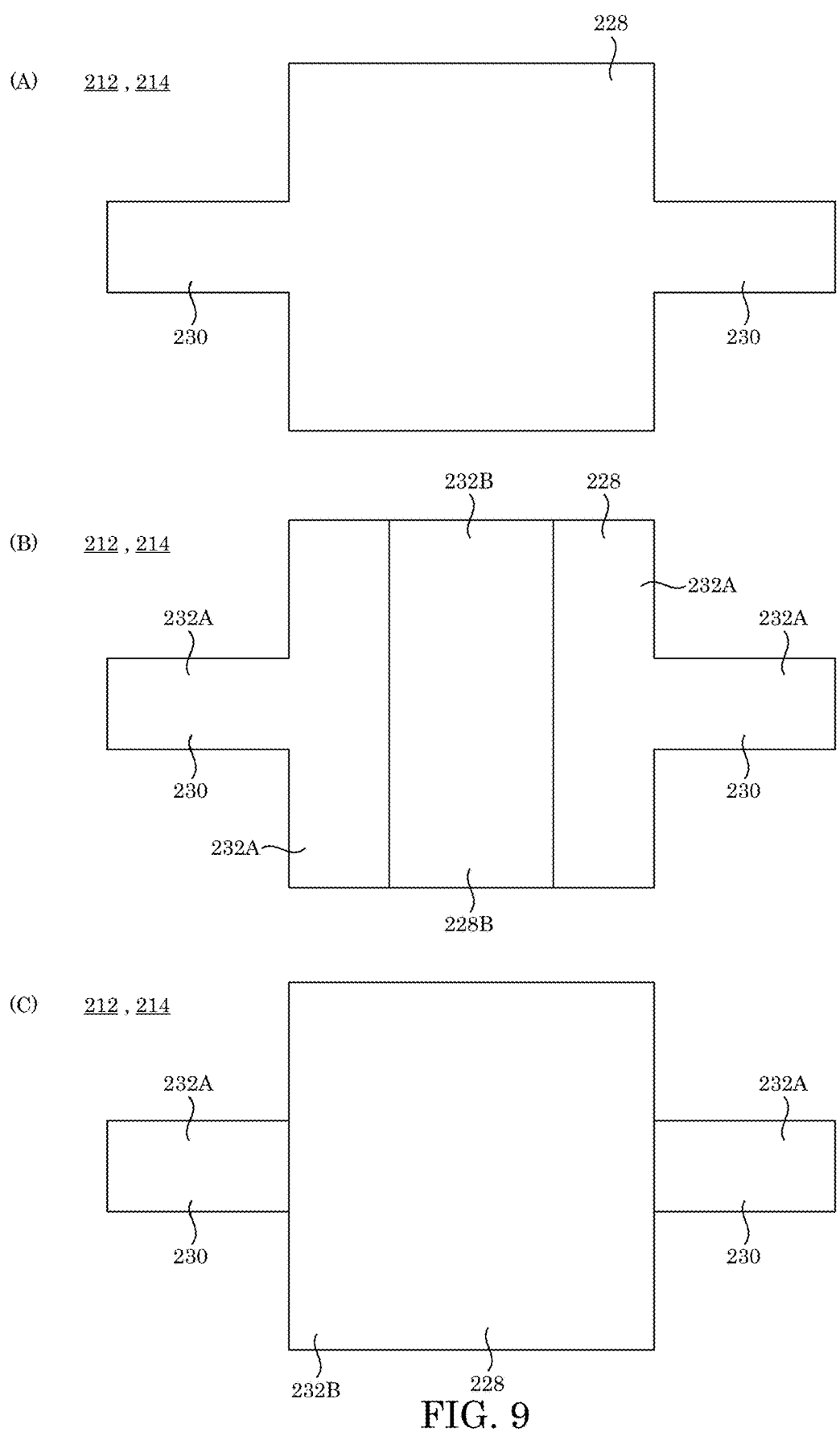
FIG. 9 shows a top view of a micromechanical vibrasolator 200 in panel A, panel B, and panel C.

In an embodiment, with reference to panel A of FIG. 9, monophone 228 has a homogenous material in a direction perpendicular to direction of vibration 220 of the in-plane vibrational mode of micromechanical resonator 210. In an embodiment, with reference to panel B of FIG. 9, monophone 228 has a heterogenous material in a direction perpendicular to direction of vibration 220 of the in-plane vibrational mode of micromechanical resonator 210, such as first material 232A and second material 232B. According to an embodiment, monophone 228 have material 232B that is different than material 232A of phonophore arm 230 as shown in panel C of FIG. 9.

Figure 10:
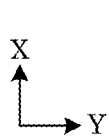
FIG. 10 shows a top view of a phonophore arm 230 in panel A, panel B, panel C, and panel D.
Figure 10:
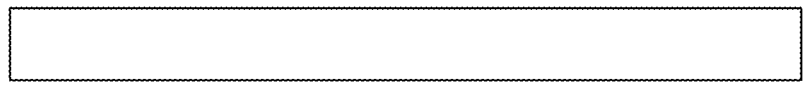
Figure 10:
Figure 10:
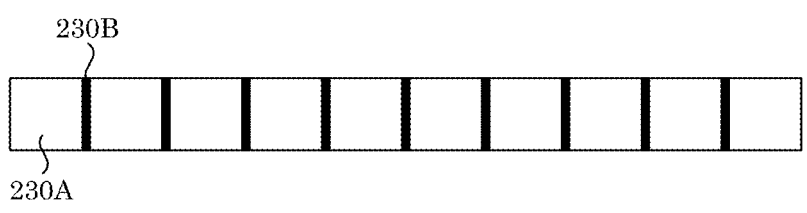
Figure 10:
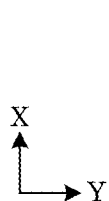
Figure 10:
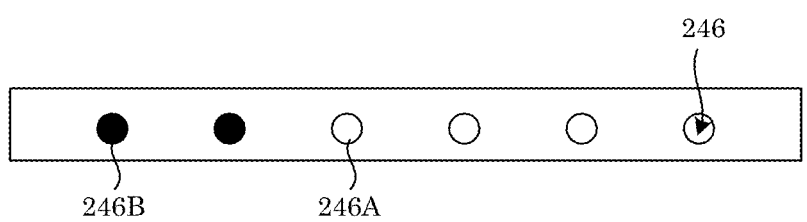
Figure 10:
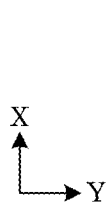
Figure 10:
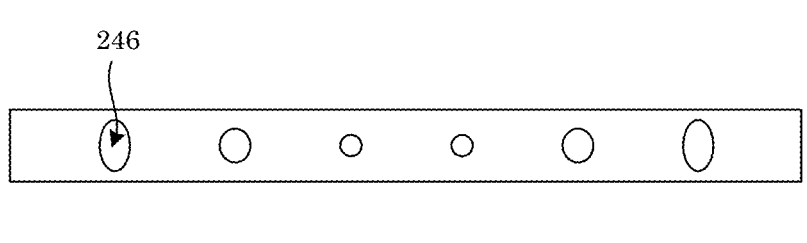

Phonophore arm 230 can be a polygonal connecting element between monophones and can be composed of silicon, silicon dioxide, silicon nitride, silicon carbide, aluminum nitride, gallium nitride, or a metal, where the material is selected to achieve a desired acoustic velocity or acoustic impedance. In an embodiment, phonophore arm 230 includes a straight beam with a rectangular cross-section that is smaller than the dimensions of the connecting monophone. A volumetric size of phonophore arm 230 can be from 0.125 $\mu m^3$ to 1 $mm^3$, specifically from 1 $\mu m^3$ to 0.001 $mm^3$, and more specifically from 125 $\mu m^3$ to 15000 $\mu m^3$. Phonophore arm 230 has a length, width, and thickness orthogonal to its length and width that independently can be from 0.5 $\mu m$ to 1 mm, specifically from 1 $\mu m$ to 100 $\mu m$, and more specifically from 5 $\mu m$ to 25 $\mu m$. Phonophore arms 230 in bandgap mirror (212 or 214) can have identical lengths or widths. In an embodiment, phonophore arm 230 in bandgap mirror (212 or 214) have different lengths, widths, thickness. According to an embodiment, phonophore arm 230 in bandgap mirror (212 or 214) have identical lengths, widths, thickness, wherein in a phonophore arm its length can be the same or different than its width or thickness. With reference to FIG. 10, phonophore arm 230 can have a homogenous material as shown in panel A. As shown in panel B, phonophore arm 230 can have a graded material composition, e.g., with alternating first material 230A and second material 230B. As shown in panel C, phonophore arm 230 can have a plurality of apertures 246 to create a periodic structure that reflects acoustic waves in synchrony with the monophones. Apertures 246 can be free of material disposed inside aperture 246 (e.g., aperture 246A) or can have material disposed in the aperture, e.g., aperture 246B. The material disposed aperture 246B can increase the reflectivity of the photonic band gap mirror. Exemplary materials include silicon, silicon dioxide, silicon nitride, and other low dissipation materials. Apertures 246 can have a same or different cross-sectional shape, area, or size as shown in panel D of FIG. 10.

Abutment 216 supports the phononic bandgap mirrors and can be composed of the same materials as the mirrors or different materials.

Substrate 218 provides a base for the micromechanical resonator and does not need to have specific design elements besides supporting the abutment 216 or the phononic bandgap mirrors, 212 and 214, directly.

Support 226 provides added rigidity to the phononic bandgap mirror, which may be necessary when the number of monophone and phonophore pairs becomes large, typically around five or more. Support 226 minimizes a change in reflectivity of the phononic bandgap mirror that can result from making the support thin and long in comparison to the phonophore.

Actuator 238 can involve electrostatic actuation with a parallel plate design. In addition, the actuator can use an electrostatic comb design, electrothermal force, electromagnetic force, dielectric force, piezoelectric effect, photothermal effect, and radiation pressure.

Micromechanical vibrasolator 200 can be made in various ways. In an embodiment, a process for making micromechanical vibrasolator 200 includes forming substrate 226; optionally forming support 226 on substrate 218; forming first abutment 216A on substrate 218; forming second abutment 216B on substrate 218; forming monophone 228 and phonophore arm 230 on first abutment 216A to form first phononic bandgap mirror 212; forming monophone 228 and phonophore arm 230 on second abutment 216B to form second phononic bandgap mirror 214; forming micromechanical resonator 210 on and; and optionally forming actuator 238 on substrate 218 to make micromechanical vibrasolator 200.

A process for making micromechanical vibrasolator 200 includes providing a substrate that has a thin film on it that is used as a sacrificial layer, and a second layer on top of the sacrificial layer, which is the device layer. The substrate can have a thickness between 50 $\mu m$ and 1 mm. The sacrificial layer can have a thickness between 50 nm and 5 $\mu m$. The device layer can have a thickness between 50 nm and 200 $\mu m$. The substrate, sacrificial layer, and device layer can be composed of silicon, silicon dioxide, silicon nitride, silicon carbide, aluminum nitride, gallium nitride, metal, or other suitable materials. When necessary for actuation and sensing of the micromechanical resonator, electrical contacts are made to the device layer and substrate using additional metal layers. The device layer is etched using a plasma etch process to form the micromechanical resonator, photonic bandgap mirrors, abutments, and supports. A liquid or vapor etchant or isotropic plasma etch process are used to remove the sacrificial layer underneath the micromechanical resonator and phononic bandgap mirrors while maintaining contact to the substrate underneath the abutments.

In the process for making micromechanical vibrasolator 200 with heterogenous structures as shown in FIG. 9 and FIG. 10, the fabrication process above is modified to include feature etch, material deposition, and chemomechanical polishing steps. Starting with a substrate with sacrificial and device layers, apertures like those shown in FIG. 10 are etched into the device layer using a plasma etch process. A material is then deposited onto the device layer using a process that can be low pressure chemical vapor deposition, plasma enhanced chemical vapor deposition, atomic layer deposition, sputtering, or evaporation. Sufficient material is deposited to completely fill the apertures. The deposited material can be selected to have high acoustic impedance contrast compared to the device layer to improve the reflectivity of the phonophores and monophones. The top surface of the substrate is planarized using chemomechanical polishing down to the device layer. This creates isolated filled apertures. The typical fabrication can then proceed from this point.

Micromechanical vibrasolator 200 has numerous advantageous and unexpected benefits and uses. In an embodiment, a micromechanical vibrasolator 200 can be used as an oscillator within a solid-state clock due to the increase in quality factor, which is important for improved clock stability. Implementation of micromechanical vibrasolator is compatible with existing methods for fabricating, packaging and controlling micromechanical clocks and improves existing technologies by an order of magnitude or more.

Micromechanical vibrasolator 200 and processes disclosed herein have numerous beneficial uses, including in radio frequency filters, resonant sensors, such as gyroscopes and accelerometers, and for biological and chemical sensing through adsorbed molecules on the micromechanical resonator. Advantageously, micromechanical vibrasolator 200 overcomes limitations of technical deficiencies of conventional micromechanical resonators, which are typically limited in the achievable quality factor due to the loss of acoustic energy through conventional tether designs.

Moreover, micromechanical vibrasolator 200 and processes herein have advantageous properties. In an aspect, the phononic bandgap mirror can include monophones and phonophores of different size, where the geometry is selected to achieve high acoustic reflectivity in more than one frequency band. This aspect can be used to maximize the quality factor for multiple resonance modes. In another aspect, the geometry of the monophones and phonophores can make the phononic bandgap mirror highly reflective at frequencies other than the resonance frequencies of the micromechanical resonator. This aspect can be used to stop external vibrations, such as those from other micromechanical resonators on the same substrate, from perturbing a specific micromechanical resonator.

Micromechanical vibrasolator 200 and processes herein unexpectedly result in a quality factor that can be an order of magnitude larger than achieved with conventional straight beam tethers. Moreover, micromechanical vibrasolator 200 has been shown to be capable of reaching a quality factor that indicates that tether loss is no longer the dominant energy dissipation mechanism, indicating that the phononic bandgap mirror can yield exceptional reflectivity. In this case, other dissipation mechanisms, and in particular phonon-phonon interaction, determine the achievable quality factor.

The articles and processes herein are illustrated further by the following Examples, which are non-limiting.

EXAMPLES

Example 1. Phononic Crystal Tether as a Phononic Bandgap Mirror in a Micromechanical Vibrasolator for Approaching an Intrinsic Quality Factor Limit of a Micromechanical Resonator/

A one-dimensional phononic crystal (1-D PnC) tether can significantly reduce tether loss in micromechanical resonators to a point where the total energy loss is dominated by intrinsic mechanisms, particularly phonon damping. Multiple silicon resonators are designed, fabricated, and tested to provide comparisons in terms of the number of periods in the PnC and the resonance frequency, as well as a comparison with conventional straight-beam tethers. The product of resonance frequency and measured quality factor (f×Q) is a figure of merit that is inversely related to total energy dissipation in a resonator. For a wide range of frequencies, devices with PnC tethers consistently demonstrate higher f×Q values than the best conventional straight-beam tether designs. The f×Q product improves with increasing number of PnC periods, and at a maximum value of $1.2 \times 10^{13}$ Hz, approaches limiting values set by intrinsic material loss mechanisms.

Micromechanical resonators are components of sensor systems, stable timing sources, and radio frequency signal processing systems. There is a continual drive to improve the quality factor (Q) of resonators since high Q is involved in high-resolution sensors, low-noise clocks, and efficient radio frequency filters. The mechanical energy that would ideally be trapped in the resonant mode of vibration is dissipated through a variety of mechanisms, leading to a reduction in Q. Intrinsic dissipation mechanisms are dependent on the resonant mode and internal structure of the resonator, and redistribute the mode energy through phonon-, electron-, or defect-mediated scattering or thermoelastic damping (TED) within the resonator body. Extrinsic dissipation mechanisms are classical damping mechanisms (e.g., fluidic damping, mass-loading, surface/interface loss, and tether loss), where energy is lost to the environment. For bulk acoustic mode resonators operating in vacuum packages, the dominant dissipation mechanisms are phonon loss, thermoelastic damping, and tether loss. Phonon loss is a result of the anharmonicity of the material lattice, while TED is due to the irreversible heat flow across thermal gradients induced during vibration. Tether loss is the energy lost through the tethers to the substrate anchors, which the phononic bandgap mirror herein overcomes.

The tethers herein minimize an amount of elastic energy that leaks through to the substrate. In particular, described is the quality factor of a micromechanical vibrasolator that include width-extensional mode bulk acoustic resonators (WE-BARs) with 1-D PnC tethers. A comparison is made with the straight-beam tethers. Unlike piezoelectric resonators, the micromechanical vibrasolator in this Example includes a monolithic resonator composed of one material, single-crystal silicon and excludes energy losses in piezoelectric materials, metal electrodes, and at material interfaces of composite resonators, providing tether-loss optimized resonators. By nearly eliminating extrinsic or design-dependent loss mechanisms, bulk acoustic resonators approach quantum limits of mechanical motion and displacement sensitivity, while operating at very high frequencies, or function as high-performance timing units that can bridge the gap between low-performance quartz clocks and chip-scale atomic clocks. As some of the dissipation processes are frequency dependent, the metric used for comparison in this Example is the product of resonance frequency and measured quality factor (f×Q), which is inversely proportional to the total energy dissipation.

Figure 11:
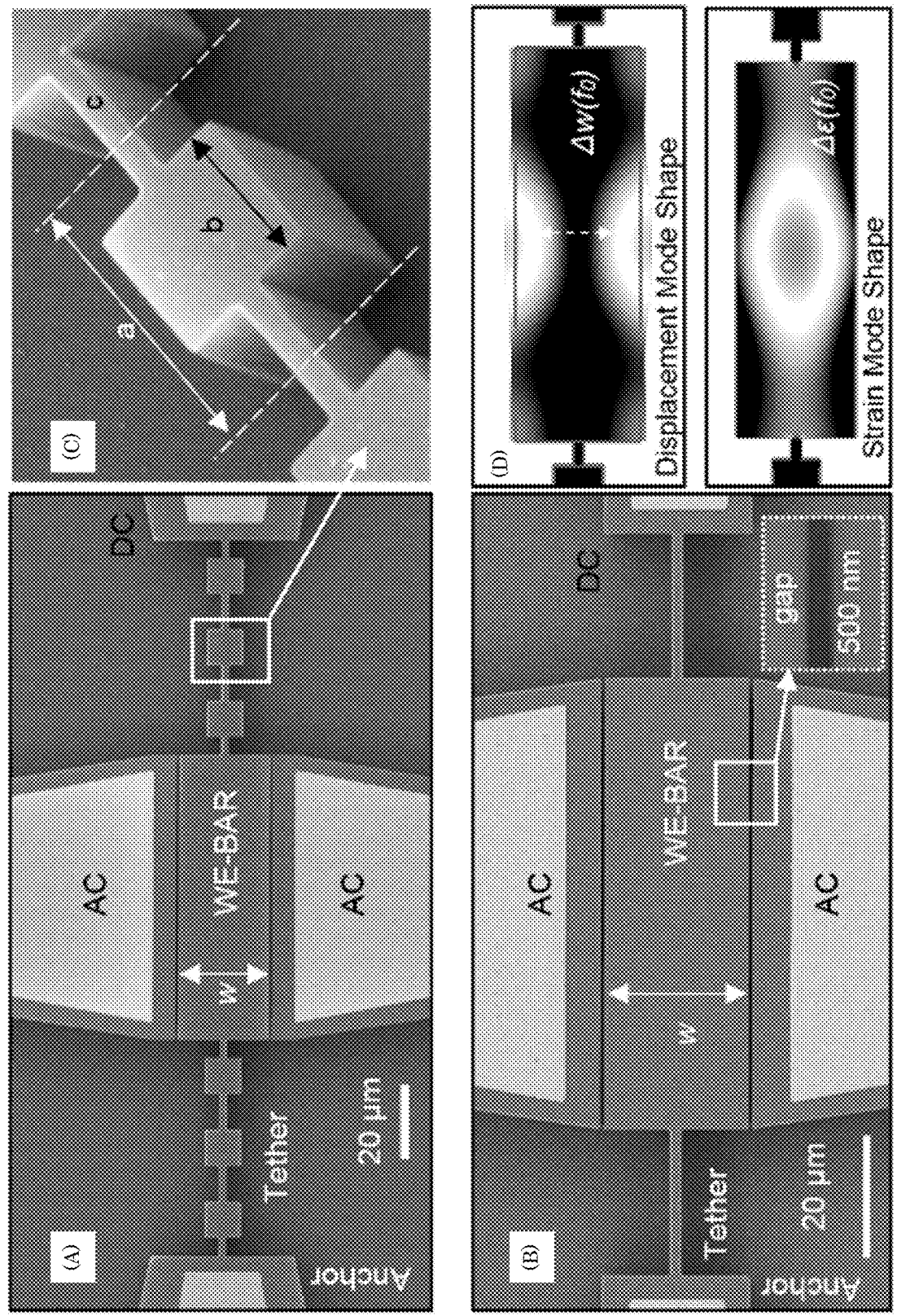
FIG. 11 shows scanning electron micrographs of micromechanical vibrasolators in which: panel A shows 3-period PnC tethers, panel B shows λ2 length straight-beam tethers; panel C shows a perspective view of a PnC unit cell, and panel D shows expected mode shapes at resonance for displacement and in-plane strain obtained from finite element analysis.
Figure 13:
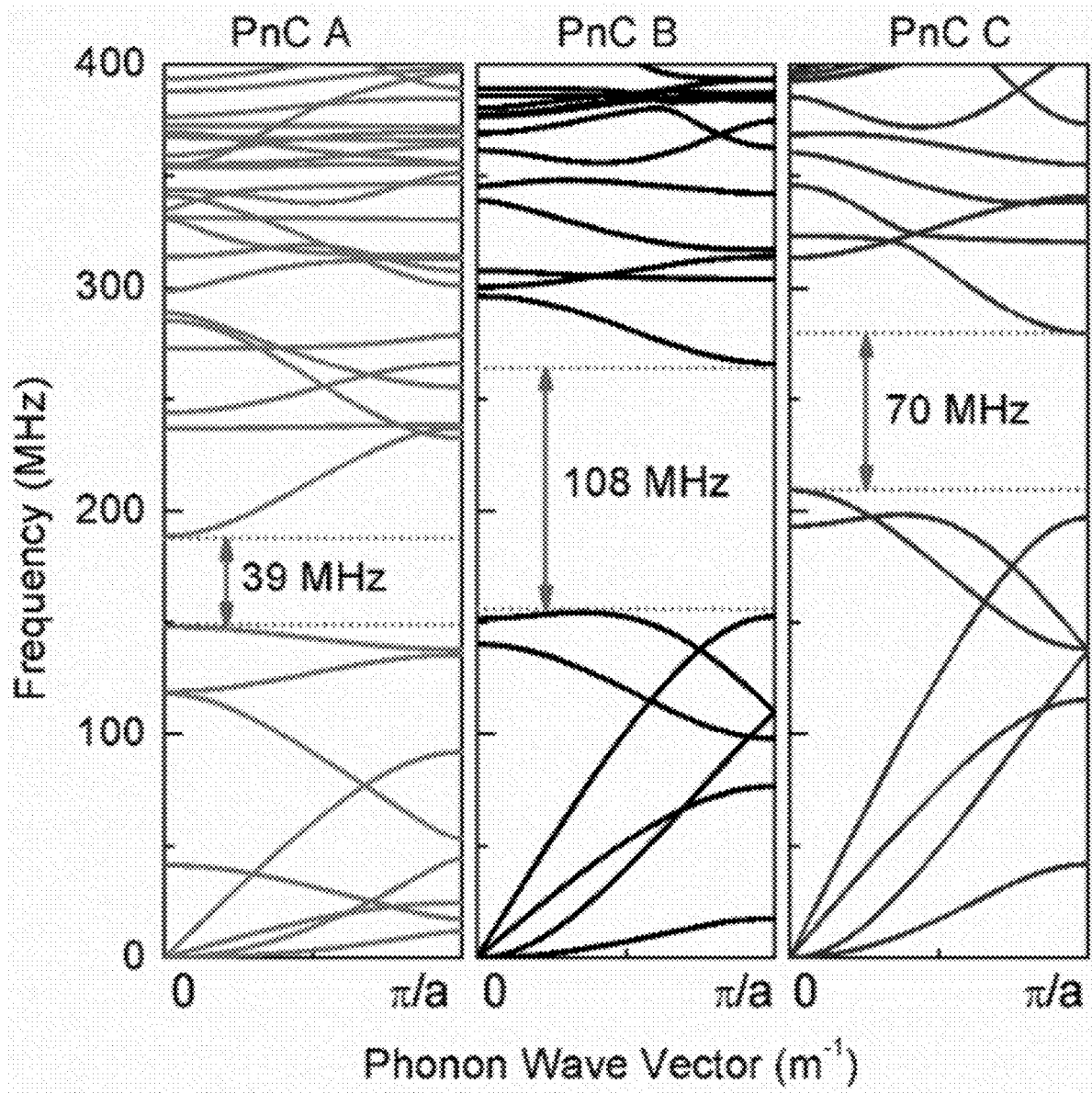
FIG. 13 shows graphs of frequency versus phonon wave vector for phononic dispersion curves and complete bandgaps of three PnC unit cell designs that were obtained from finite element analysis of unit cells with 1-D Floquet periodic symmetry, wherein WE-BARs were designed so that the fundamental resonance frequency is within the bandgap that confined energy efficiently in the body of the resonator and reduced tether loss.

FIG. 11 shows an electrostatic WE-BARs and simulated mode shapes of a fundamental mode. The fundamental resonance frequency of the WE-BAR is approximated by $f_0 = v/\lambda = v/2w$, where v is the longitudinal acoustic wave velocity, w is the resonator width, and λ is the acoustic wavelength. Three groups of WE-BARs have been studied (A, B and C), with fundamental frequencies of 167 MHz, 227 MHz and 282 MHz, respectively. Each group has seven tether designs: three PnC designs with 1-, 3-, and 5-unit cells each, and four conventional straight-beam tether designs with tether lengths equal to λ/8, λ/4, 3λ/8 and λ/2, all with a tether width of 2 μm. The PnC unit cells (panel C of FIG. 11) are mass-link designs with 1-D connectivity and a period, a, that is optimized for wide bandgaps. 15 Given the number of design variables, multiple solutions exist and practical constraints such as silicon layer thickness, lithographic resolution, and robustness are considered for the final PnC design. The PnC unit cell is composed of a square block of side b and two symmetric beams, each of length (a−b)/2 and width c. The ideal phononic bandgaps are found using finite element analysis with 1-D Floquet periodic symmetry (i.e., an infinite chain of unit cells) and a wide parametric sweep for a, b and c. Design details of the resulting resonator and PnC tethers are provided in FIG. 12. While the fabricated PnC tethers are not infinite chains, as assumed in the finite element analysis, the design procedure does result in highly reflective phononic crystals, even for 1-unit PnCs. Complete bandgaps shown in FIG. 13 are expected to be wider due to deaf bands comprised of shear or z-polarized twisting modes that do not transmit longitudinal waves across the tethers.

All resonators are fabricated on the same silicon-on-insulator (SOI) wafer, which has a 10 μm±0.5 μm thick device layer of <100>silicon with a resistivity of 0.01-0.02 Ω-cm, a 2 μm±0.5 μm thick buried oxide layer, and a 500 μm thick handle wafer. Bond pads consist of 10 nm/200 nm Cr/Au layers deposited using electron-beam evaporation and a liftoff process. After metallization, a 380 nm thick SiO2 hard mask layer is deposited using plasma enhanced chemical vapor deposition and patterned using optical lithography and reactive ion etching. The Si etch uses deep reactive ion etching (DRIE) with an optimized process that yields smooth sidewalls (each etch cycle is 80 nm deep, with a scalloping of less than 15 nm). The entire depth of the device layer is etched, monolithically defining the resonator, tethers and anchors. The wafer is diced and resonators are released from the substrate by etching away the SiO2 hard-mask and buried oxide using vapor-phase hydrofluoric acid etching. Finally, resonators are mounted on a chip carrier and signal pads are wire-bonded. The use of a thick SOI device layer, and a single lithography and etch step for defining the resonator and tethers significantly reduce the possibility of asymmetry, which could potentially reduce the Q.

Figure 14:
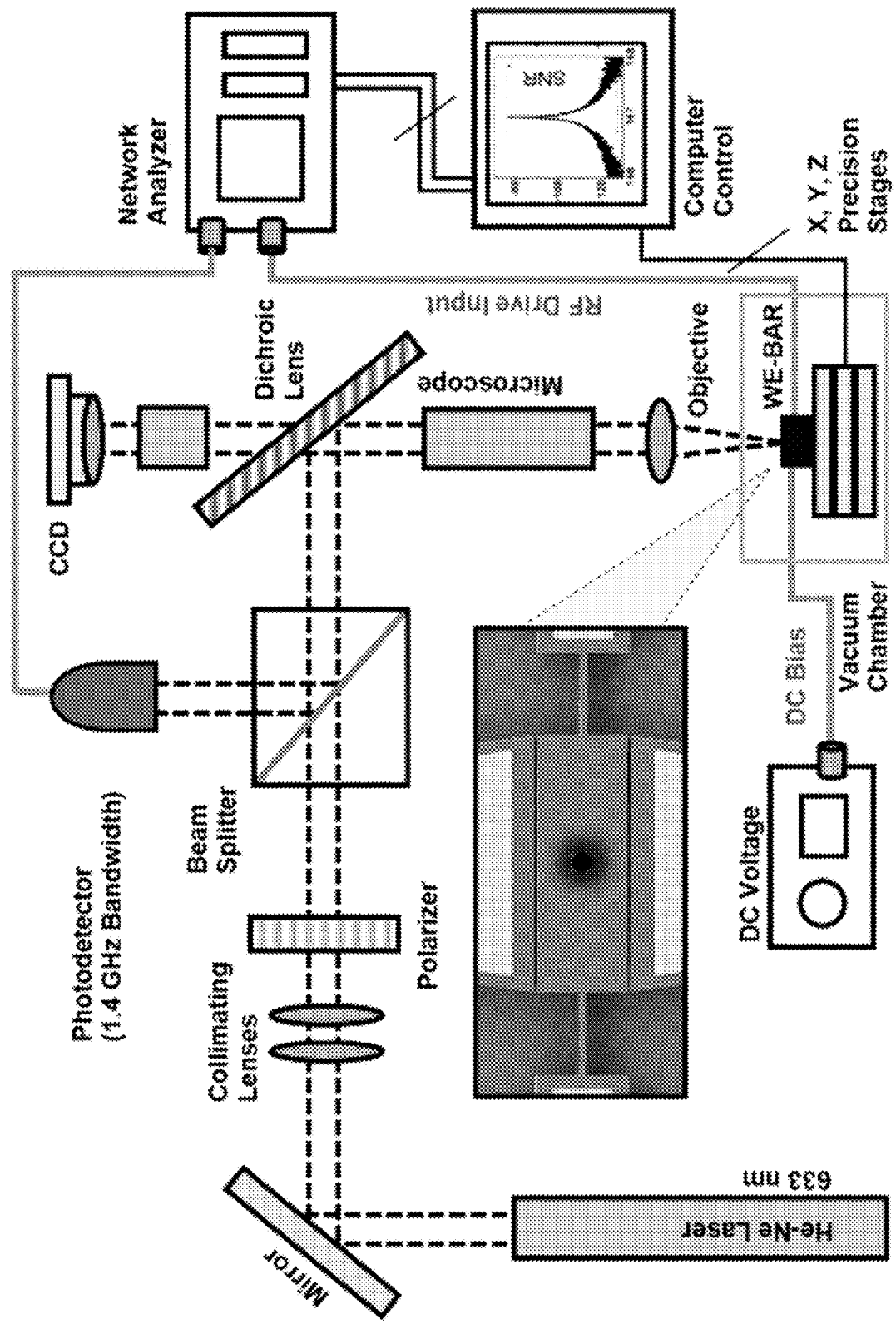
FIG. 14 shows a system for photoelastic strain measurements of a WE-BAR at high vibration frequencies, wherein an intensity stabilized He—Ne laser was a probe with free-space optics, including mirrors, collimators, and a long working distance microscope objective, that focused a laser beam on a surface of the WE-BAR; the WE-BAR was disposed in a vacuum chamber with signal feed-through for RF and DC input signals, and reflected, strain-modulated laser signal was detected by a fast photodetector with a bandwidth of 1.4 GHz.

FIG. 14 shows a schematic of a system for operating the micromechanical vibrasolator with optical and control elements. The resonators were tested at room temperature in a vacuum chamber with a pressure less than 6.67 mPa (50 µTorr). The WE-BARs are actuated electrostatically by applying a 10 mW AC input from a network analyzer to the two lateral electrodes and a 21 V DC bias voltage to the body of the resonator, VDC. Instead of an electrical readout, which can suffer from high-frequency feedthrough parasitics, the photoelastic effect is used to optically measure the mechanical resonance. As the resonator vibrates, the body of the resonator undergoes in-plane strain. The strain modulates the refractive index of the material, and consequently the amplitude of the reflected light from a He—Ne probe laser (≈100 µW incident power). The reflected light is measured using an ultra-fast Si PIN photodetector with a bandwidth of 1.4 GHz, and the output of the photodetector is measured with the network analyzer. A three-axis motion stage with a position resolution of 10 nm is used to precisely position the WE-BAR under test. The geometric center of each resonator is used consistently for all measurements, as maximum in-plane strain is expected there (see strain mode shape in panel D of FIG. 11). Optical knife-edge displacement measurements on the free edge of the WE-BAR were used for independent confirmation of the results. The measured frequency and Q from both measurements are nearly identical for each WE-BAR, indicating that these parameters are inherent to the resonator and independent of the measurement technique.

Figure 15:
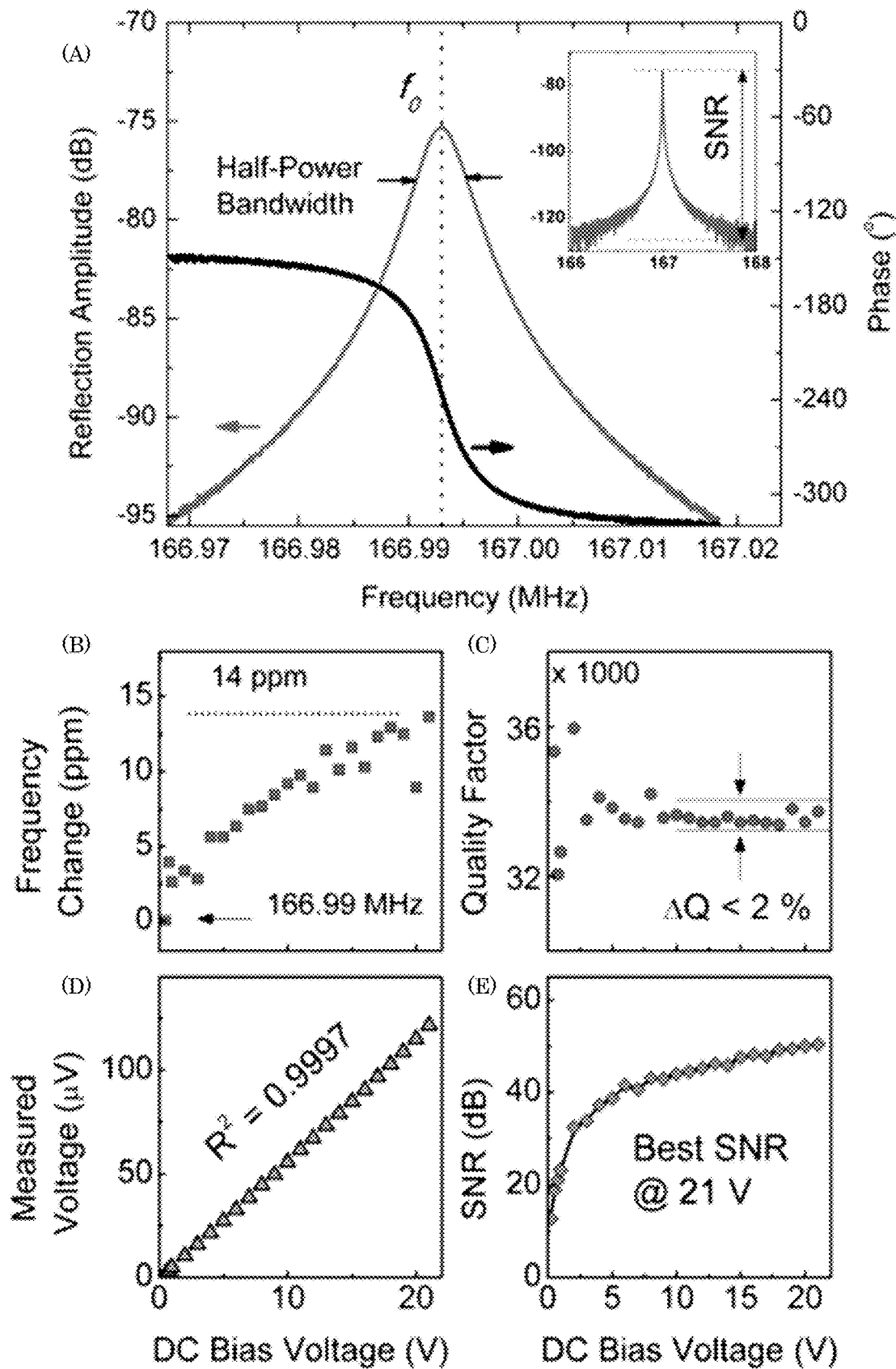
FIG. 15 shows a graph of reflection amplitude versus frequency in panel A and graphs of various parameters versus DC bias voltage in panel B, panel C, panel D, and panel E for resonance measurements in which panel A includes amplitude and phase response using a photoelastic measurement for a WE-BAR with an inset for SNR, wherein panels B-E show the resonance frequency, quality factor, maximum signal amplitude, and SNR respectively as functions of VDC.

Panel A of FIG. 15 shows a typical response from the photoelastic measurement with reflected signal magnitude and phase showing a clear mechanical resonance with narrow linewidth (high Q) and large signal-to-noise ratio (SNR). Panels B, C, D, and E of FIG. 15 show evolution of mechanical resonance as a function of VDC. The resonance frequency increases slightly as VDC increases up to 21 V due to a weak mechanical nonlinearity in panel B. The measured Q at low VDC values varies significantly, as seen in panel C. These variations in Q are not physical and are due to the low SNR, demonstrating the need for high SNR when quantitative Q measurements are required. Panel D shows that the resonator amplitude is linearly related to VDC, as expected for an electrostatic resonator, since the resonator strain is linearly proportional to the voltage measured by the network analyzer, where the highest SNR is at 21 V as shown in panel E. To maximize SNR and minimize measurement uncertainty in Q, all further measurements are consistently reported at VDC=21 V and 10 mW AC power.

Figure 16:
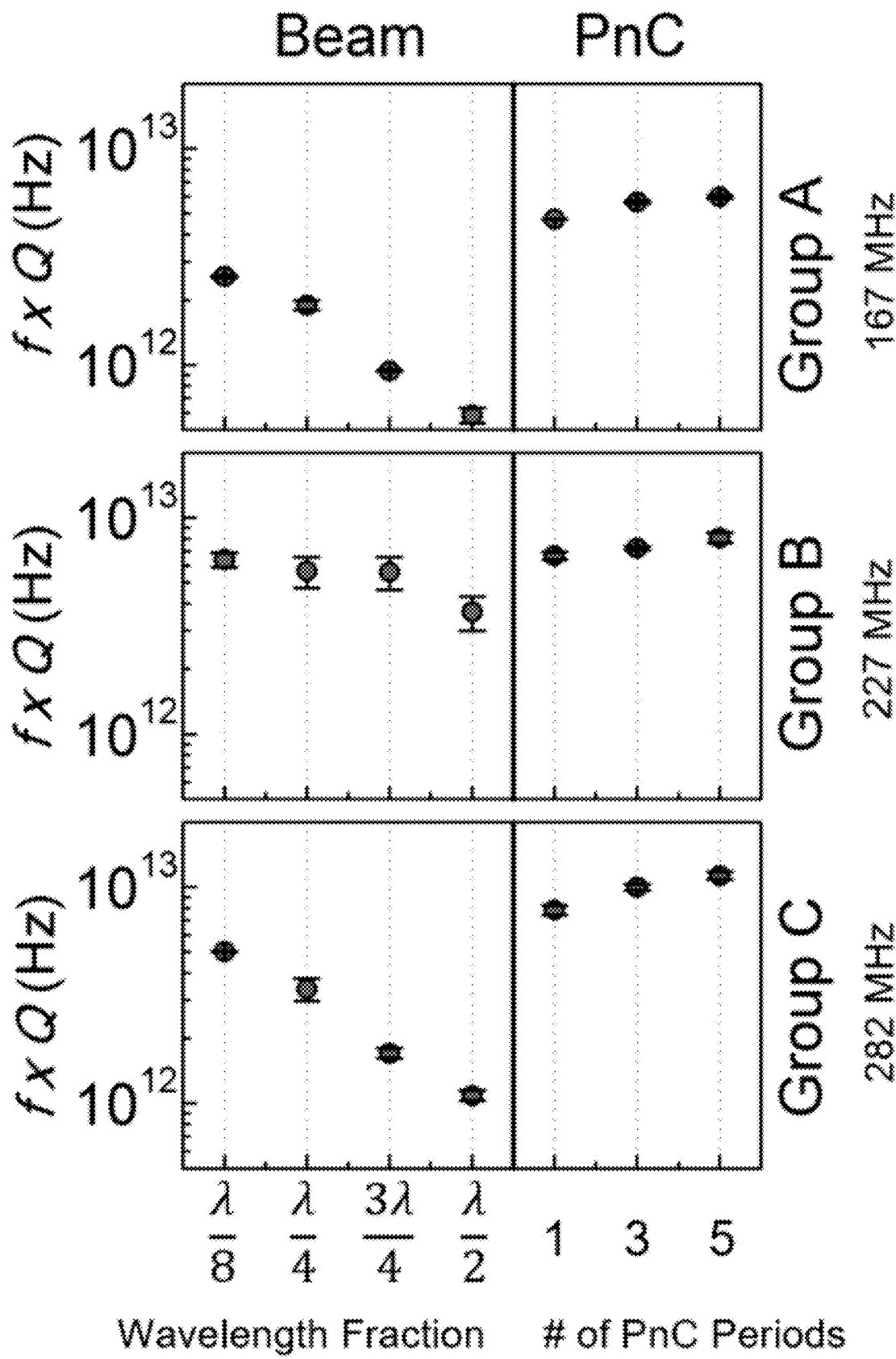
FIG. 16 shows graphs of frequency product, f×Q, versus wavelength fraction and number of periods wherein measured f×Q products for each WE-BAR group as a function of tether design in which PnC tethers had from 1 to 5 unit cells for each tether while the straight-beam tethers had varying lengths that were fractions of acoustic wavelength, and error bars are standard deviation of measured values.

Measured values of the f×Q product for all three groups are shown in FIG. 16 as a function of the tether design. In every group of identical resonators, devices with 1-unit PnC tethers have a higher f×Q product than any of the straight-beam tether devices. As the number of PnC cells increases to 3 and 5 units, the f×Q product continues to increase. For the straight-beam tethers, transmission line theory indicates that the $\lambda/4$ tethers should provide the best isolation and the $\lambda/2$ tethers the worst isolation. This is found to only be partially true. While the $\lambda/2$ tethers consistently demonstrate the worst performance, the $\lambda/4$ tethers do not achieve the best results. The shorter $\lambda/8$ tethers outperform the $\lambda/4$ tethers on average. This is supported by other evidence that favors shorter tethers 11, showing that the simple transmission line model breaks down for finite tether dimensions, and suggests that the tether loss has a more nuanced dependence on the relation between the wavelength, dimensions, and aspect ratios for the straight-beam tethers. The measured f×Q products for Group B (227 MHz) follow the expected trend but have a lower observed intragroup variation for straight-beam tethers.

Figure 17:
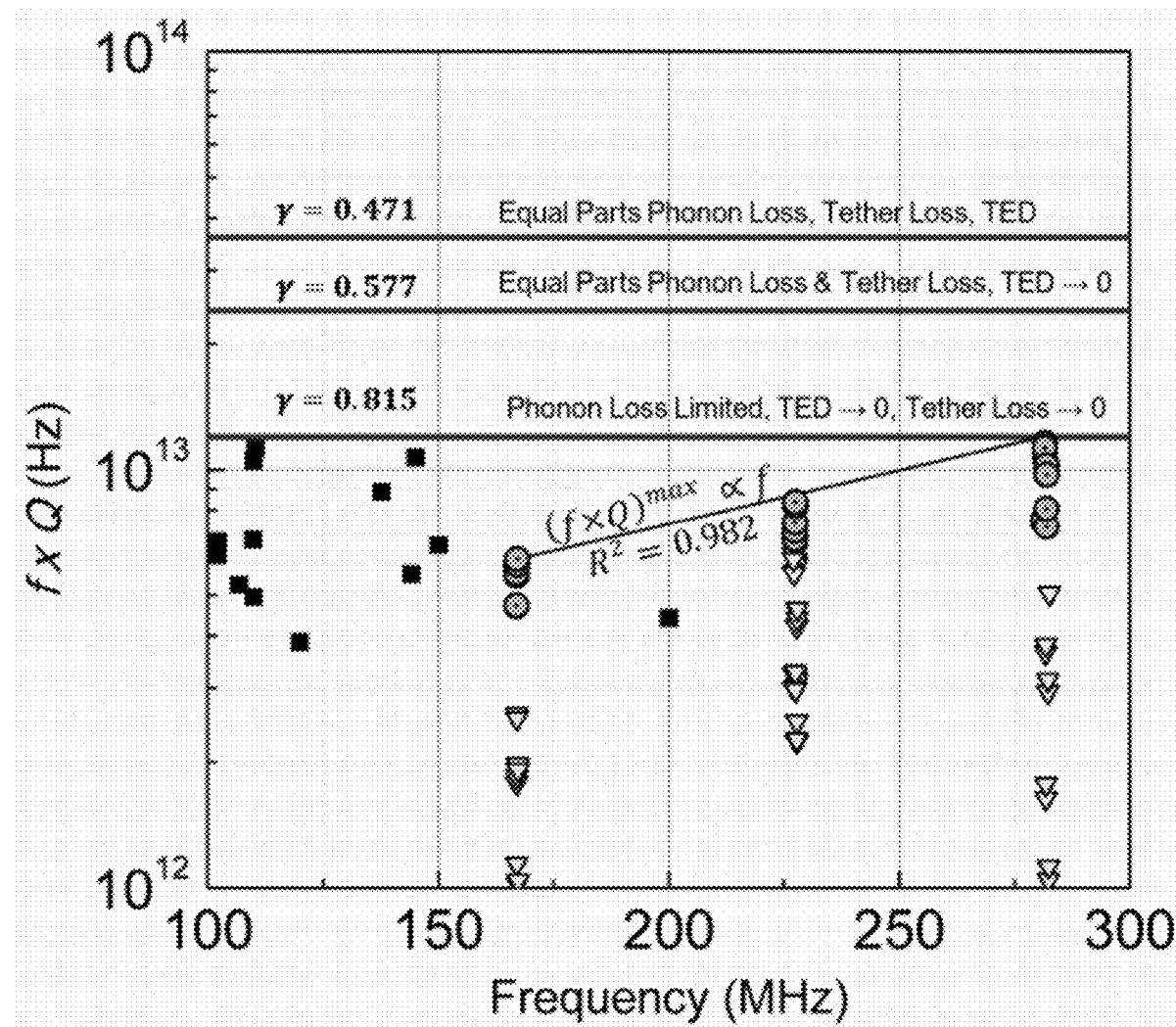
FIG. 17 shows a graph of frequency product, F×Q, versus frequency for measured f×Q products for PnC tether WE-BARs (circles) and straight-beam tether WE-BARs (triangles) compared to reported values (squares) as a function of frequency, and a maximum f×Q of $1.2 \times 10^{13}$ Hz was measured at 282 MHz.

FIG. 17 shows measured f×Q data for all devices across the frequency spectrum and measured values for various silicon WE-BARs within the targeted frequency range. The WE-BARs measured in this study are some of the highest frequency WE-BARs operating in their fundamental mode. The f×Q values are greater than or equal to the highest previously reported values for silicon resonators at higher frequencies. The maximum f×Q product measured in this study is $1.2 \times 10^{13}$ Hz at 282 MHz (Group C, 5-period PnC tethers).

The total f×Q product can be written as $(f \times Q_{total})^{-1} = \Sigma (f \times Q_i)^{-1}$ for i contributing loss mechanisms. For WE-BARs here, total dissipation is largely dominated by tether loss and phonon loss, with a smaller contribution from TED, based on analytical models for the two latter mechanisms. For phonon loss in the Akhieser damping regime ($2\pi f_0 \tau \ll 1$, where $\tau$ is the phonon lifetime), the f×Q product can be expressed as $f \times Q_{phonon} = (\rho v^2)/(2\pi C_v T \gamma^2 \tau)$, where $\rho$, v, $C_v$, T, and $\gamma$ represent the mass density, longitudinal acoustic velocity, the volumetric heat capacity, the temperature and the Grüneisen parameter, respectively. Most of these parameters have been well characterized for silicon with low uncertainty. The exception is the Grüneisen parameter which has a wide range of reported values. Fitting the highest measured f×Q value to f×Qphonon ($\gamma$), and assuming accepted material properties, yields $\gamma=0.815$. The implicit assumption in this calculation is that the highest measured f×Q is limited only by phonon loss. To provide a point of comparison, $\gamma$ can also be calculated assuming the measured f×Q is comprised of equal parts tether and phonon loss, or equal parts TED, phonon, and tether loss. These two cases recover unrealistically low values of $\gamma$, 0.577 and 0.471, respectively as shown in FIG. 17. This comparison indicates that the first calculation ($\gamma=0.815$) is closest to the real situation. However, it is not intended to assign values to $\gamma$ or to exactly apportion total loss amongst the various mechanisms. From this analysis, it is reasonable to conclude that the optimized 1-D PnC tethers play a large role in eliminating tether loss and that the best measured designs presented in this work have f×Q values approaching the fundamental phonon loss limits. In contrast to the PnC tethers, the measured f×Q values for straight-beam tether devices fabricated on the same substrate and with the same material properties are well below the most conservative values of the phonon loss and TED limits, leading to the conclusion that they are tether limited.

The experiments also reveal a trend where, as shown in FIG. 17, the maximum measured f×Q product increases with frequency (from Group A-Group C). As the f×Q limits for the Akhieser regime of phonon loss and TED are independent of frequency, the best tether designs in each group are either: i) not yet fully optimized (i.e., the PnC reflectivity can be improved further), or ii) are limited by the residual, frequency dependent effects of some other loss mechanisms. Further separation and isolation of tether loss, phonon loss, and TED can be accomplished by testing these devices under varying temperature since the temperature dependence of tether loss is expected to be small relative to other mechanisms.

Figure 18:
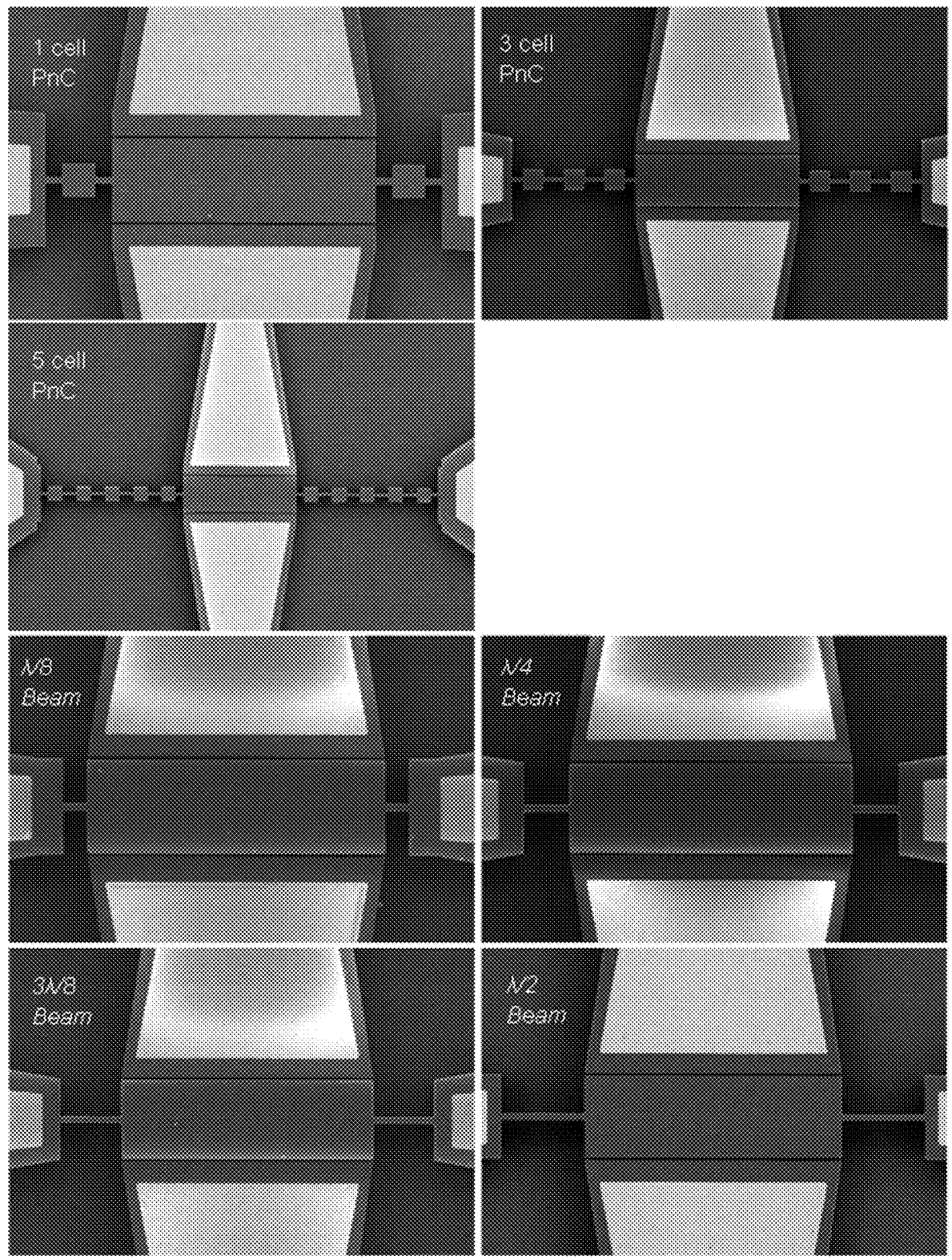
FIG. 18 shows scanning electron micrographs for top views of WE-BARs from Group A, with 3 PnC tether designs and 4 straight beam tether designs.

With regard to tether designs, design details of WE-BARs and PnC tethers for each Group are shown Table 1. The expected fundamental resonance frequency of each WE-BAR is approximated by $f_0 = v/\lambda = v/2w$, where v is the longitudinal acoustic wave velocity, w is the resonator width, and $\lambda$ is the acoustic wavelength. In addition to the PnC tethers specified below, each group has four conventional straight-beam tether designs with tether lengths equal to $\lambda/8$, $\lambda/4$, $3\lambda/8$ and $\lambda/2$, all with a tether width of 2 Representative images showing all seven tether designs for Group A are shown in FIG. 18.

TABLE 1

WE-BAR Specifications

| Group | w (μm) | l (μm) | λ (μm) | Expected Frequency (MHz) | Measured Frequency (MHz) |
|---|---|---|---|---|---|
| A | 25.5 | 80 | 51 | 162 | 167.06 ± 0.09 |
| B | 18.5 | 75 | 37 | 224 | 227.61 ± 0.17 |
| C | 14.5 | 60 | 29 | 286 | 281.86 ± 0.40 |

PnC Tether Specifications

| Group | a (μm) | b (μm) | (a − b)/2 (μm) | c (μm) | Bandgap (MHz) |
|---|---|---|---|---|---|
| A | 20 | 10 | 5 | 2 | 149-188 |
| B | 10 | 9 | 0.5 | 1 | 156-264 |
| C | 10 | 9 | 0.5 | 2 | 209-279 |

Figure 19:
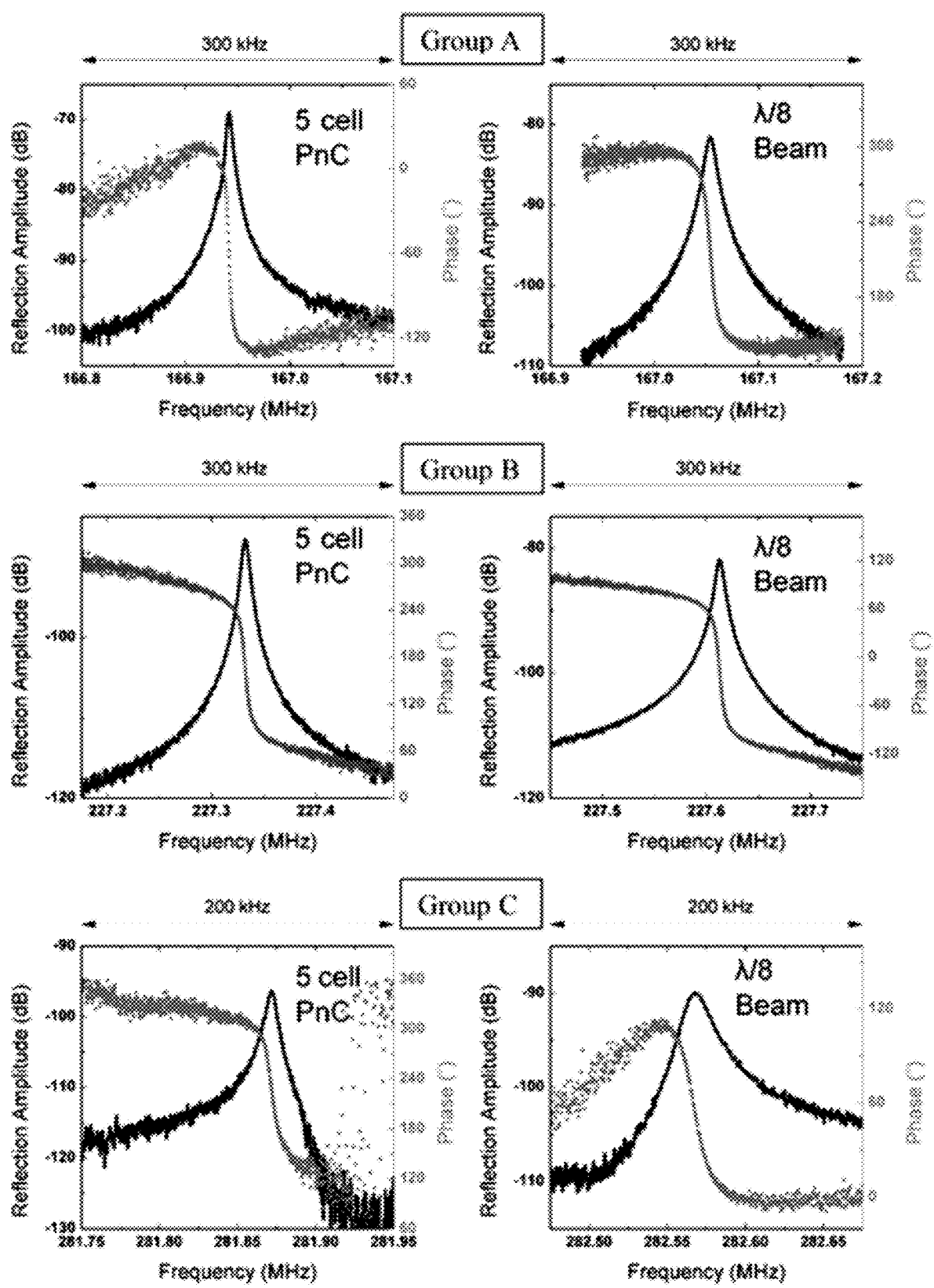
FIG. 19 shows graphs of reflection amplitude versus frequency for reflection amplitude and phase for PnC tether design (5-cell design) and straight-beam tether design (λ/8) for each group, wherein spectral response acquired from PnC tether designs show a narrower resonant linewidth and higher Q than straight beam devices in the same group.

FIG. 19 shows spectral response (both reflection amplitude and phase) of some PnC and the straight-beam tethers in each group. For ease of comparison, the frequency axes in each group show the same span, visually indicating that the PnC tether devices have a sharper mechanical resonance (higher Q).

For bulk acoustic wave resonators, the two dominant intrinsic energy loss mechanisms in the body of the device are thermoelastic damping (TED) and phonon loss due to the anharmonicity of the crystal lattice itself. For the spectral region $\omega\tau \ll 1$, where $\tau$ is the phonon lifetime, the phonon loss can be described by classical acoustic wave models and referred to as Akhieser loss or Akhieser regime phonon loss. Analytical models for the maximum loss (limiting value of fxQ) for both loss mechanisms are presented. Equations below are show direct equations for fxQ. All symbols and parameters are given in Table 2.

With regard to phonon loss a limiting form of $f \times Q_{phonon}$ is given by $$f \times Q_{phonon} = \frac{\rho v^2}{C_v T \gamma^2} \cdot \frac{1}{2\pi} \cdot \frac{1 + (\omega\tau)^2}{\tau}$$

In the Akhieser limit $\omega\tau \ll 1$, the $f \times Q_{phonon}$ is independent of frequency, and reduces to:

$$f \times Q_{phonon} = \frac{\rho v_l^2}{2\pi C_v T \gamma^2 \tau}$$

For thermoelastic damping (TED) loss, a limiting form of $f \times Q_{TED}$ is given by:

$$f \times Q_{TED} = \frac{1}{\Psi} \cdot \frac{1}{2\pi} \cdot \frac{C_v^2}{kT\alpha^2\rho}$$

where $\Psi$ is a shape factor based on the length/width aspect ratio. This equation is valid for longitudinal waves in a bar. Note that this situation is different from the Zener model for flexural modes.

TABLE 2

| Quantity | Symbol | Value used | Value Range |
|---|---|---|---|
| Temperature | T | 293 K | — |
| Mass density | ρ | 2330 kg/m³ | — |
| Acoustic Velocity (longitudinal) | v | 8430 m/s | — |
| Coefficient of thermal expansion | α | 2.6 × 10−6 K⁻¹ | — |
| Volumetric heat capacity | $C_v$ | 1.63 × 10⁶ J/m³K | — |
| Thermal conductivity | k | 148 W/m-K | 140-156 W/m-K |
| Phonon lifetime | τ | 6.91 ps | — |
| Mode shape factor | Ψ | | 0.1-10 |
| Grüneisen parameter | γ | | 0.17-1.5 0.91-1.08 (empirical) 1.21 (theoretical) |

Limiting values for the Akhieser regime phonon loss and TED loss are constant as a function of frequency. From the perspective of understanding Akhieser phonon loss in single-crystal elastic materials, one of the least well characterized factors is the Grüneisen parameter, γ. From Table 2, the range of measured values for γ in silicon is an order of magnitude, and $f \times Q_{phonon} \propto \gamma^{-2}$, leading to possible values spanning two orders of magnitude. Most of the other material parameters for silicon are well-characterized and can be considered constant for this analysis. Using similar arguments for the evaluation of TED, we can write $f \times Q_{TED} \propto \Psi^{-1}$. The mode shape factor W depends on the device geometry as well as the mechanical and thermal mode shapes of the resonator and can span two orders of magnitude. Under these assumptions, we can calculate $f \times Q_{pnonon}(\gamma)$ and $f \times Q_{TED}(\Psi)$ in the respective ranges of γ and Ψ from Table 2 and compare them with measured values and values reported in literature, which are shown in FIG. 17.

The maximum measured fxQ was 1.2×10¹³ Hz at 282 MHz for WE-BARs with PnC tethers. This is within the range of values for $f \times Q_{pnonon}(\gamma)$. In fact, measured results fall closely in the range of $f \times Q_{pnonon}(\gamma)$ values described by γ∈[0.7,1.2], which is close to the range calculated and experimentally measured. On the other hand, even the most conservative values for $f \times Q_{TED}(\Psi)$, using Ψ=10, results in a TED loss limit that is more than 5 times higher than the measured values. Tether loss and phonon loss play a more dominant role in setting the upper limit of fxQ compared to TED. Measured fxQ values of WE-BARs with conventional tethers are dominated by tether loss, highlighting the importance of tether design optimization if the goal is to approach fundamental intrinsic loss limits.

The models and measured results can also be used to get an estimate of the relative involvement of the three loss mechanisms investigated here. Using the maximum value of measured f×Q, the following cases are possible.

(i) The devices are fully tether-optimized, TED loss is negligible, and total loss is dominated by phonon loss:

$$f \times Q_{tether} = f \times Q_{phonon} = 1.2 \times 10^{13} \text{ Hz } \gamma = 0.815$$

(ii) TED is negligible, and the quality factor is set by equal parts phonon loss and tether loss:

$$(f \times Q_{max})^{-1} = (f \times Q_{phonon})^{-1} + (f \times Q_{tether})^{-1} f \times Q_{tether} = f \times Q_{phonon} = 2.4 \times 10^{13} \text{ Hz } \gamma = 0.577$$

(iii) The quality factor is set by equal parts of tether loss, phonon loss, and TED:

$$(f \times Q_{max})^{-1} = (f \times Q_{phonon})^{-1} + (f \times Q_{tether})^{-1} + (f \times Q_{TED})^{-1} f \times Q_{tether} = f \times Q_{phonon} = f \times Q_{TED} = 3.6 \times 10^{13} \text{ Hz}$$
$$\gamma = 0.471; \Psi = 17.19$$

FIG. 17 indicates the f×Q values for these cases. Note that Case (ii) and Case (iii) have very low values of $\gamma$. Further, Case (iii) has $\Psi = 17.19$, which is much higher than the most conservative case for $f \times Q_{TED}$ ($\Psi$). As a result, it appears that the measured f×Q values are close to being phonon limited, with some contribution from tether loss, and negligible TED loss.

The models and calculations described here are approximate and not intended to ascribe exact values to $\gamma$ and $\Psi$, or in fact, any other material properties, which will vary based on the exact materials used for making the WE-BARs. The utility of these models lies in understanding the relative importance of the three major loss mechanisms under consideration. Under credible assumptions, single crystal silicon WE-BARs operating in the Akhieser regime are affected more significantly by tether loss and phonon loss than TED. Further, tether loss can be reduced or even eliminated, leading to resonators operating near the fundamental phonon loss limits.

Example 2. Direct Measurement of Dissipation in Phononic Crystal and Straight Tethers for Mems Resonators Optical measurements of dynamic strain profiles along the tethers of microelectromechanical resonators and related mechanical quality factor (Q) are described. Such measurements quantify tether dissipation and provide comparison between tether designs. A comparison between the conventional tethers and one-dimensional phononic crystal (PnC) tethers for silicon bulk acoustic resonators is made and shows greater than 3× improvement in Q when the PnC tethers are used. The spatial decay rate of the mechanical strain profile along the tethers correlated with measured Q. Accordingly, one-dimensional PnC tethers are phononic bandgap mirrors in a micromechanical vibrasolator, also referred to herein as an electrostatic acoustic resonator.

The search for a clear and well-defined relationship between elastic energy dissipation and the quality factor (Q) of a mechanical resonator is complicated by the number of dissipation mechanisms that exist in vibrating microelectromechanical system (MEMS). These dissipation mechanisms can be categorized as intrinsic mechanisms, such as phonon, electron, and thermoelastic damping, and extrinsic mechanisms, such as viscous damping, interface loss, and tether loss. The situation is further compounded by limited success in acquiring direct, independent measurements of individual mechanisms of energy loss. Instead, most studies rely on analytical relationships, computational models, and empirical fitting to approximate the underlying physics.

Here, design-dependent extrinsic energy loss mechanisms, tether loss, is described. Tether loss (also known as anchor, clamping, or acoustic radiation loss) is the result of strain energy transmitted from the driven resonator through supporting tethers and lost to the anchoring substrate.

This Example provides direct measurements of strain energy dissipation profiles along tethers of mechanical microresonators and shows efficiency differences between designs. Optical reflection relies on photoelastic modulation of reflected light due to the harmonic strain in the resonator and measures spatially resolved strain profile on the resonator surface and along the tether. Comparative data is included for conventional and 1-D PnC tether designs for identical silicon bulk acoustic resonators (SiBARs) and verification is provided for energy lost through the PnC tethers being lower and correlated with higher resonator Q.

Tether loss can affect mechanically-supported vibrating devices. The photoelastic measurement used in this Example characterizes tethers and can be applied to materials, designs, and frequency ranges. Width-extensional mode SiBARs were used and has an electrostatic actuation model, repeatable fabrication, known material properties, and monolithic, single material, low-loss resonator with no material interfaces losses. SiBARs presented herein were fabricated on a same wafer and had nominal dimensions (80 µm×25.5 µm×10 µm, L×w×t) with an actuation gap of ~500 nm on each side. The width was the primary frequency determining dimension. Each SiBAR had a different design for its symmetric tethers. Four conventional tether designs were used and had lengths equal to $\lambda/8$, $\lambda/4$, $3\lambda/8$, and $\lambda/2$, where $\lambda = w \times 2$ is the acoustic wavelength panel a of FIG. 25.

Figure 25:
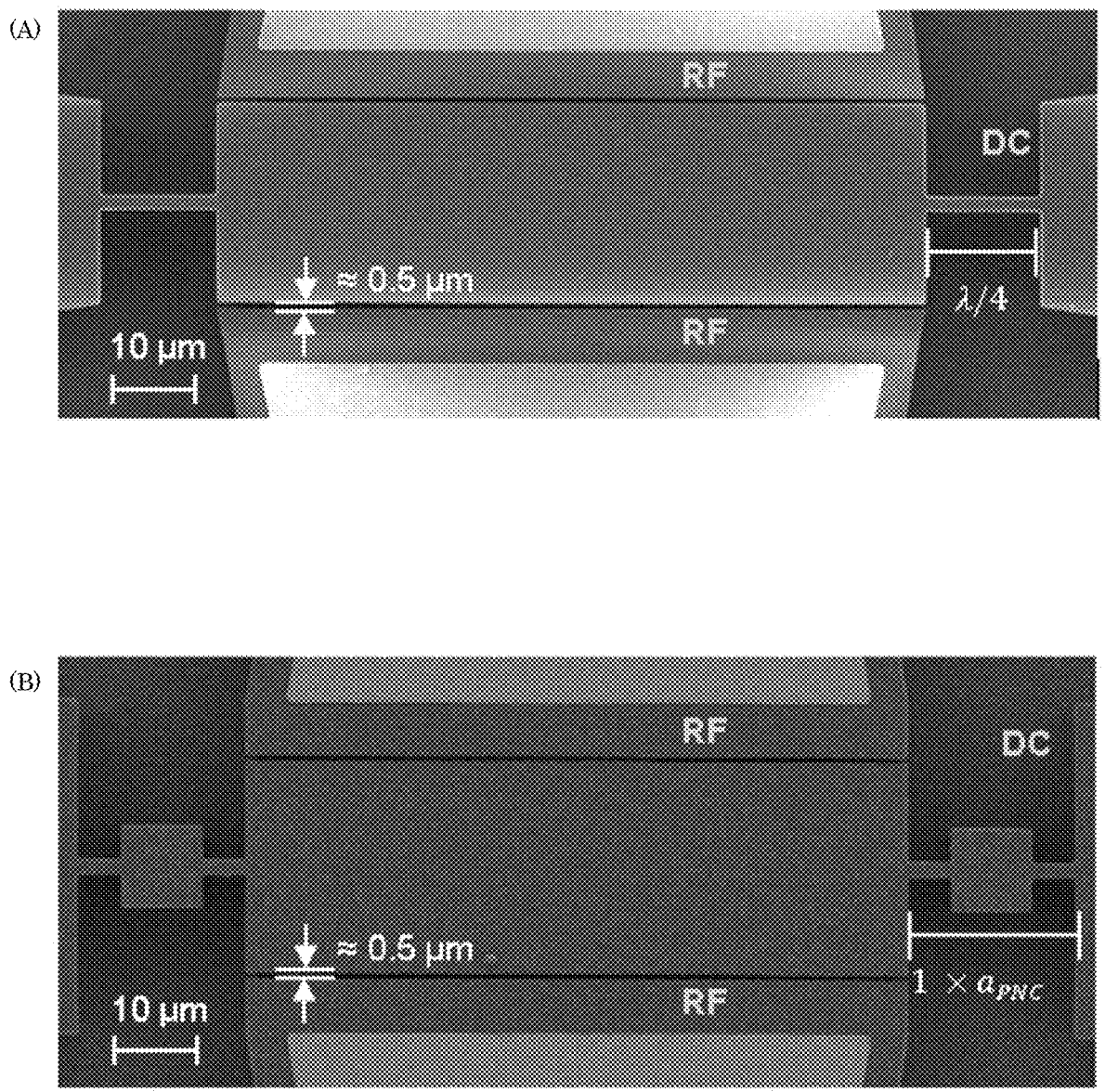
FIG. 25 shows scanning electron microscope (SEM) images of SiBARs (80 μm×25.5 μm×10 μm) with straight tethers of length λ/4 in panel A and 1-period PnC tether in panel B.
Figure 26:
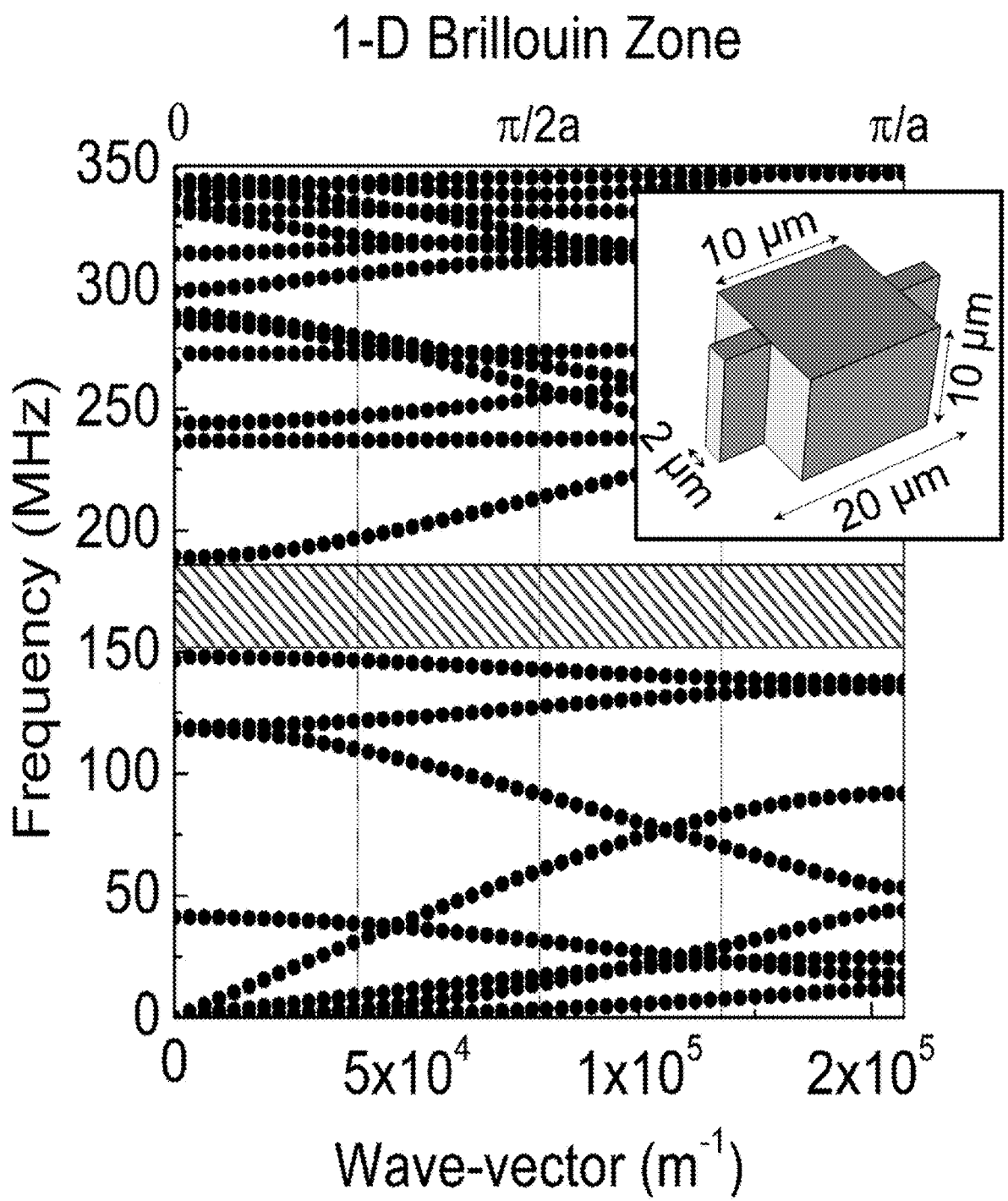
FIG. 26 shows a graph of frequency versus wave vector for a first Brillouin zone for a 1-D phononic crystal unit cell (dimensions in the inset schematic), wherein PnC design had a wide phononic bandgap (hashed) from 149 MHz to 188 MHz.

A 1-D tether comprised of repeated PnC unit cells is shown in panel B of FIG. 25 and had an ideal phononic bandgap between 149 MHz to 188 MHz (see FIG. 26) that blocked the SiBAR fundamental resonance frequency, which was expected to be 164 MHz from analytical calculations. To test dependence of the bandgap on the number of unit cells in a resonator, PnC tethers with 1, 3, and 5-unit cells were used.

With regard to a fabrication process, MEMS fabrication processes were used to make the SiBARs. The process starts with a silicon-on-insulator (SOI) wafer (10 µm device layer, 2 µm buried oxide layer). Metal electrodes were patterned using lift-off and electron-beam evaporation. The resonator, tethers, and actuation gap were defined using optical lithography and etched using deep reactive ion etching (DRIE). The resonators were released by etching the buried oxide using vapor hydrofluoric acid. The structure of the resonator and tethers was fully monolithic and made only of single crystal silicon.

Figure 27:
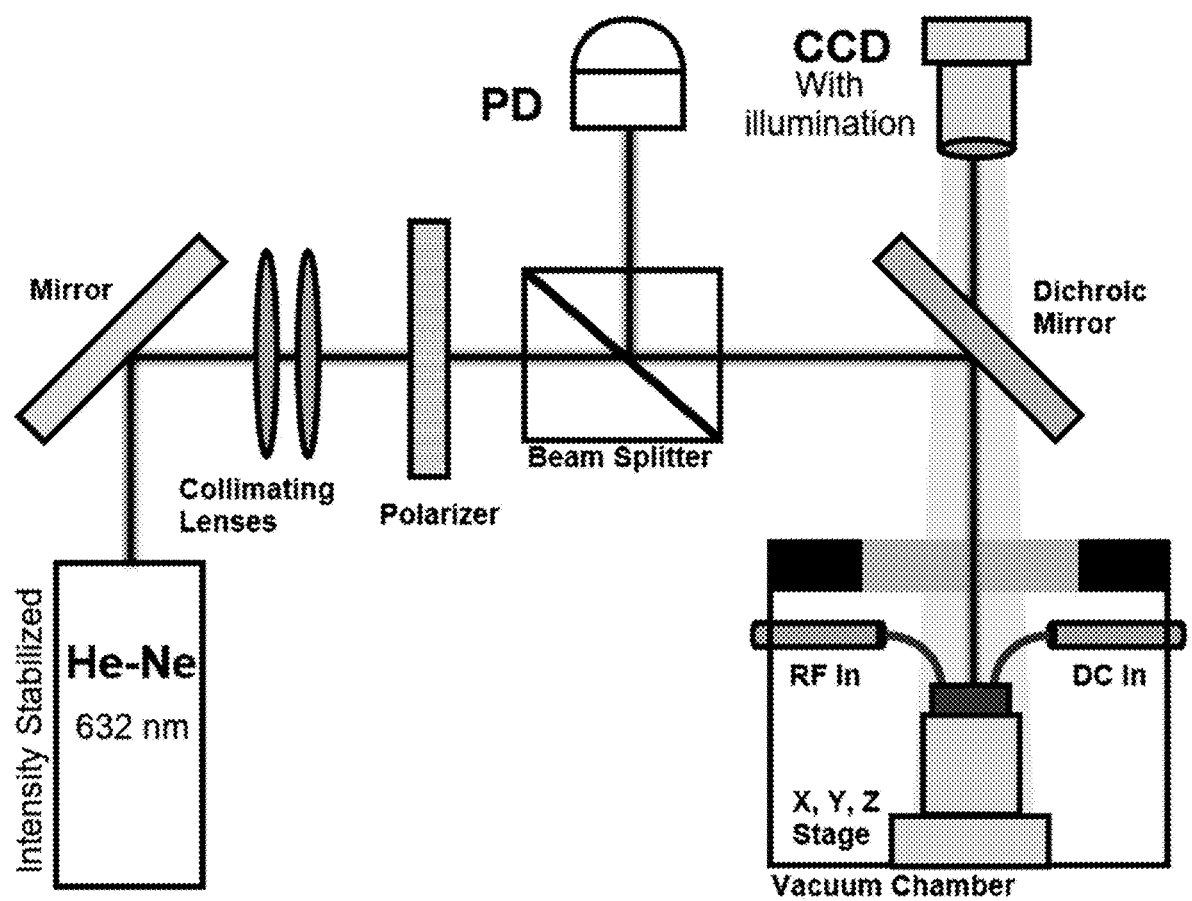
FIG. 27 shows a measurement system for photoelastic modulation measurements of in-plane dynamic strain in MEMS resonators, tethers, and anchors.

Driving the resonator into harmonic motion using DC+RF electrostatic actuation caused a harmonic change in the strain at every point on the resonator surface. This periodic strain modulated the refractive index of the material due to the photoelastic effect and modulated the reflection amplitude of a normally incident probe laser. FIG. 27 shows system for operating the resonators. An intensity-stabilized He—Ne laser was collimated and focused onto the device with a 20× microscope objective (NA=0.42, spot size~2 µm). The reflected signal, measured by a photodetector and network analyzer, provided information about the mechanical motion, including the Q. The amplitude variation as the laser was scanned along the resonator surface enables reconstruction of the strain profile in the plane.

This technique measured the strain profile along the tethers and on the anchors/substrate. As the tethers were not actively driven into motion, strain decayed as resonators were moved further from the driven resonator. The spatial rate of decay of the mechanical strain along the length of the tethers was a measure of the tether loss, independent of the other dissipation mechanisms in the environment or the body of the resonator itself. An efficient tether design had a high decay rate and did not allow significant transmission of strain energy to the anchors. Thus, directly comparison of resonator tethers and efficient designs was made.

Figure 28:
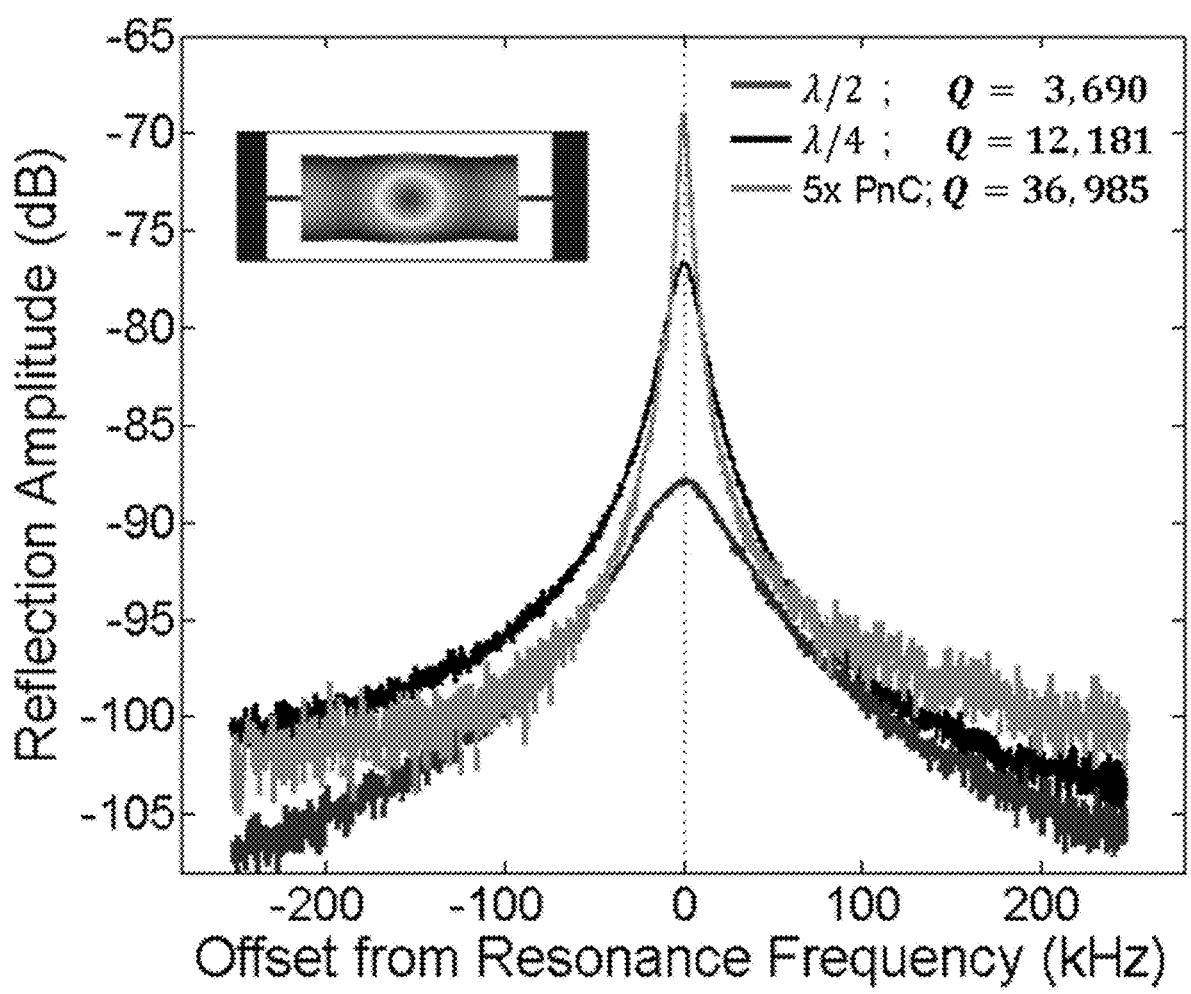
FIG. 28 shows a graph of reflection amplitude versus offset from resonance frequency for a photoelastic reflection response of three SiBARs with different tether configurations, wherein PnC tethers have sharper and stronger mechanical resonance; inset shows a vibrational mode shape of SiBAR at resonance with in-plane strain.
Figure 29:
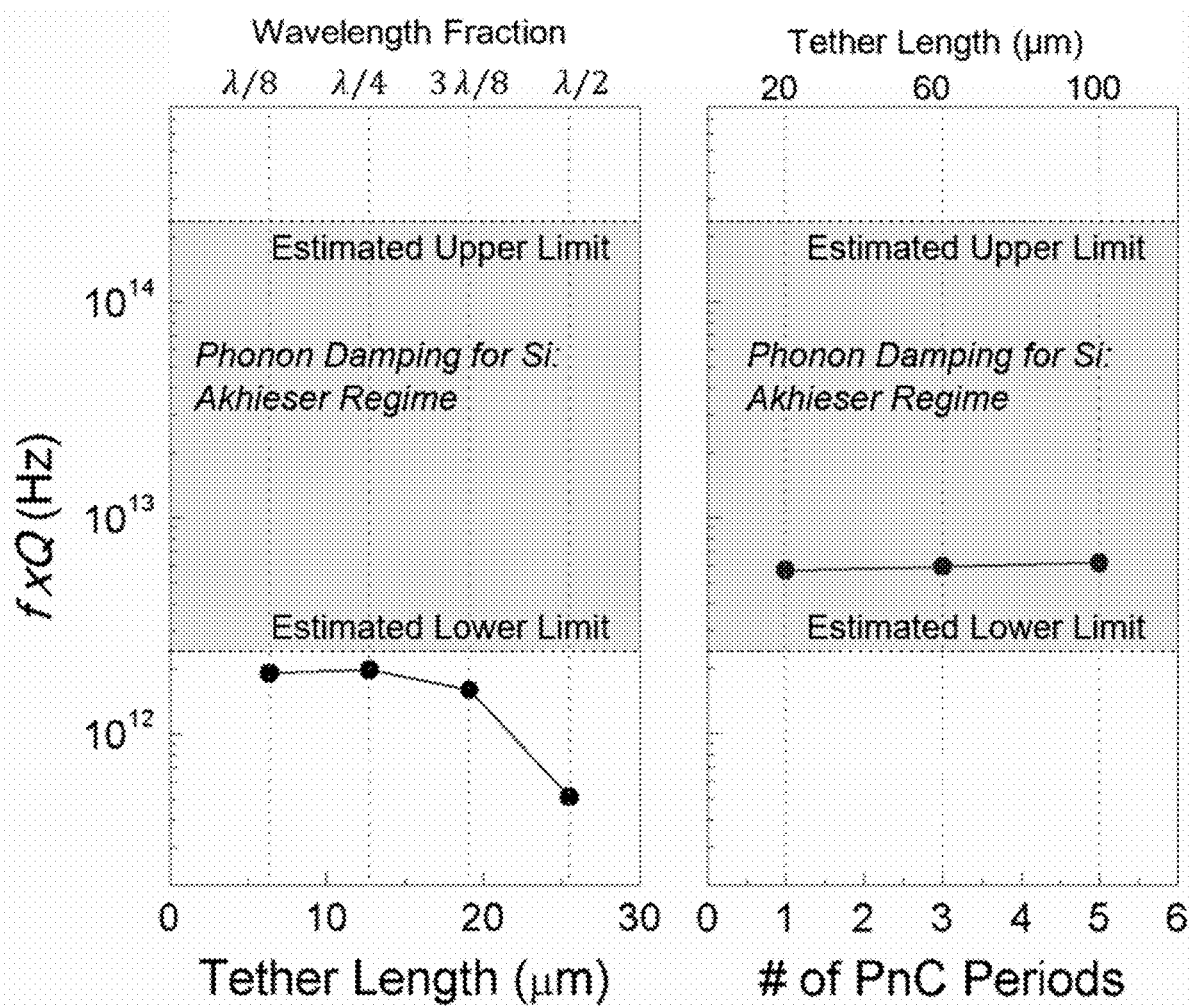
FIG. 29 shows graphs of measured f×Q values versus tether length and number of PnC periods for a same resonator design and fabrication, wherein phononic tethers outperform conventional beam tethers.

The SiBARs were actuated electrically (+21 V DC, +10 dBm RF). The average resonance frequency was 167.041 MHz ($\sigma$=0.039%). The spectral response of three representative devices is shown in FIG. 28 and shows the influence of the tether design on the performance of otherwise identical resonators.

Figure 20:
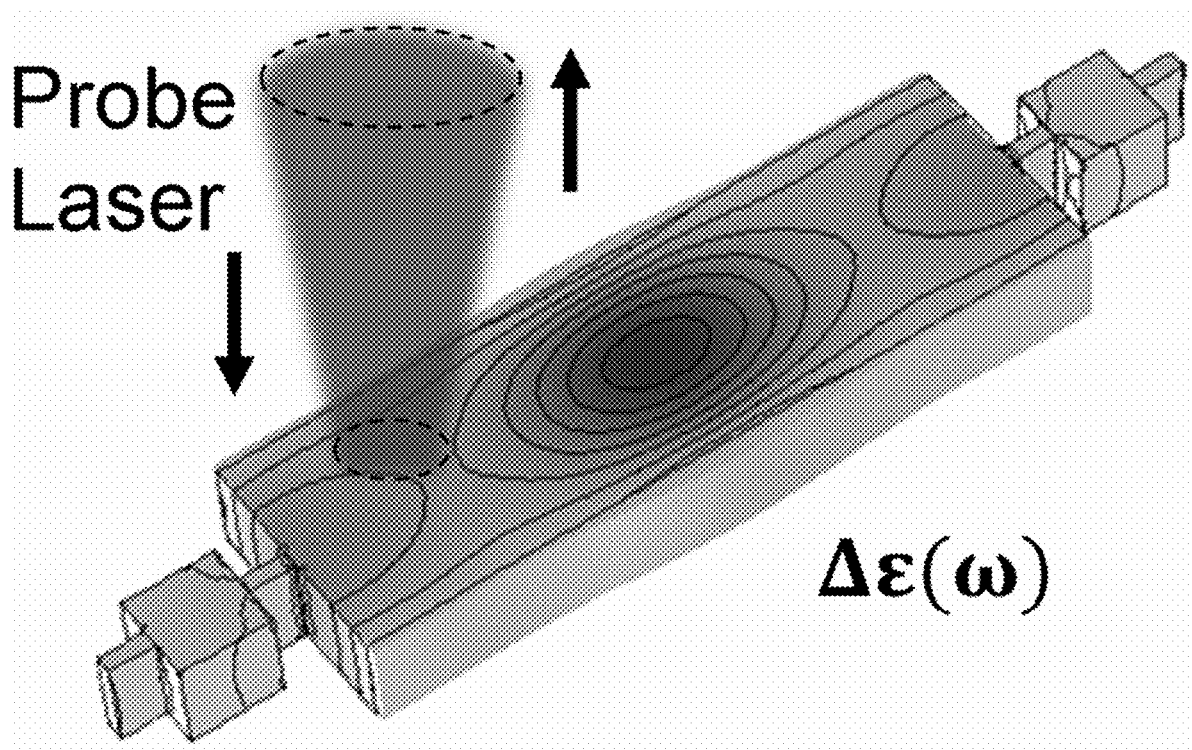
FIG. 20 shows micromechanical resonator 210 subjected to a laser light.
Figure 21:
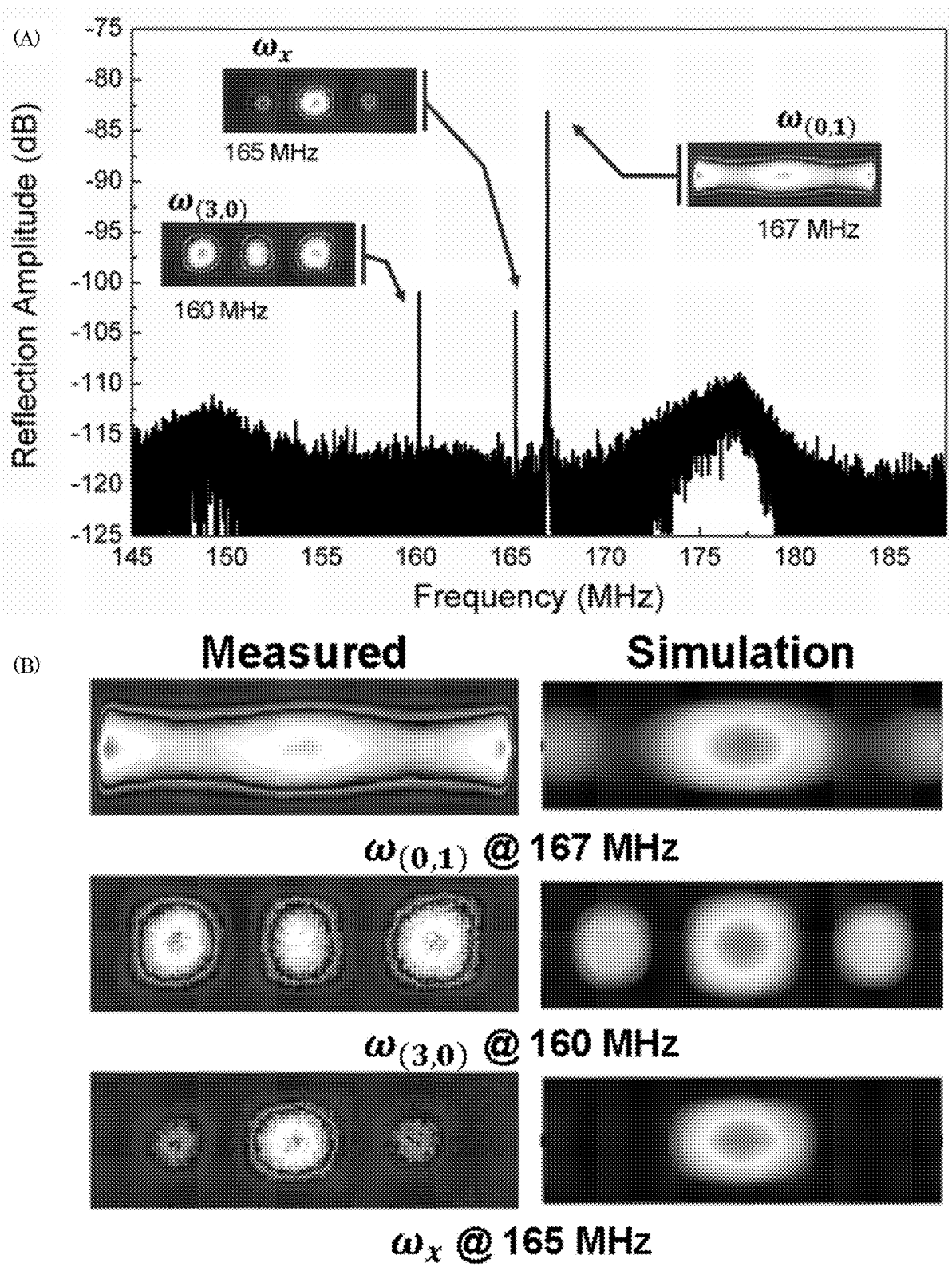
FIG. 21 shows a graph of reflection amplitude versus frequency in panel A, measured strain mode shape in panel B, and simulated strain mode shape in panel C.
Figure 22:
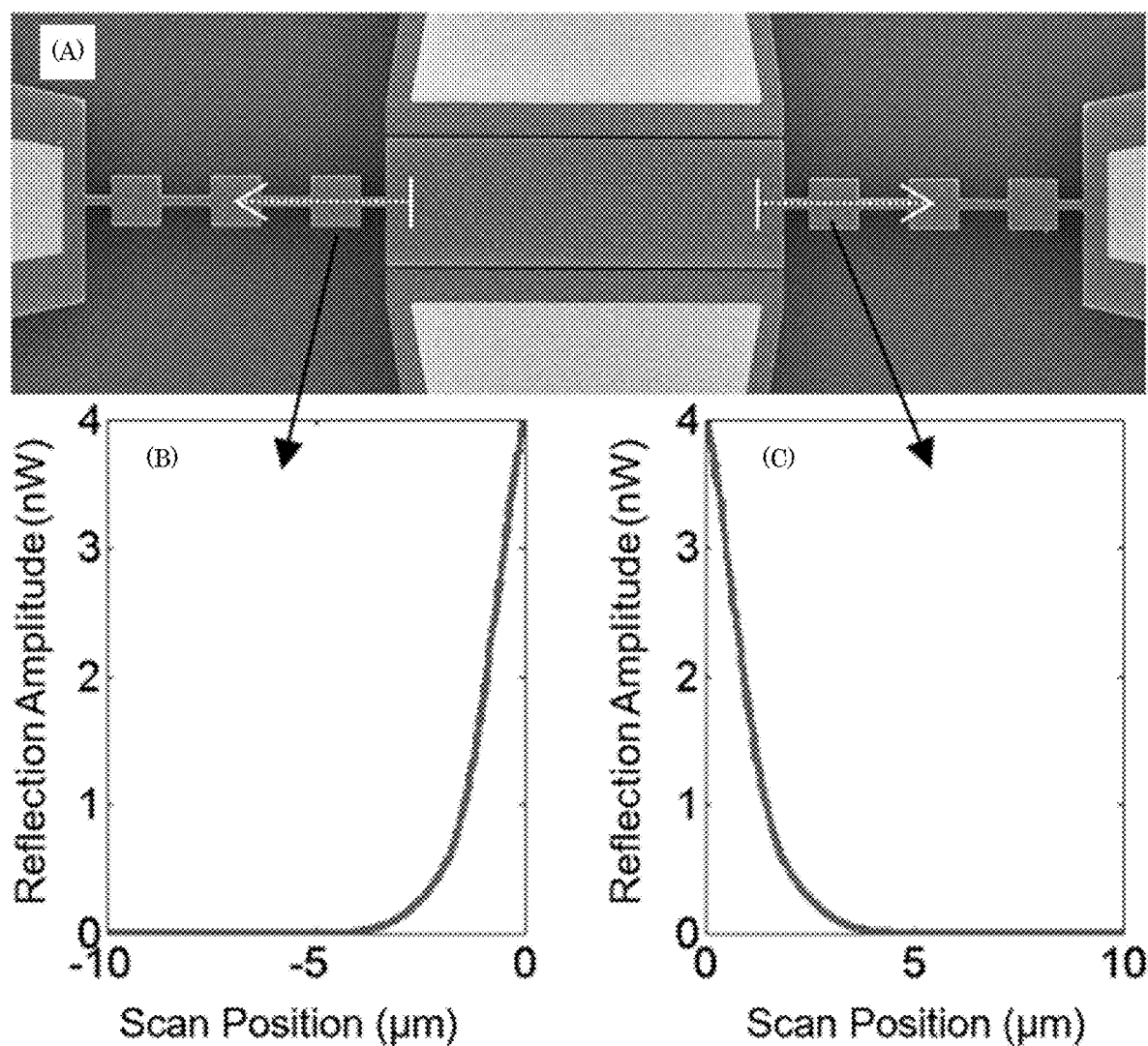
FIG. 22 shows a micromechanical resonator 210 in panel A and graphs of reflection amplitude versus scan position in panels B and C for left and right tethers, respectively.

The SIBAR was scanned relative to the probe laser along the length of the tethers using a positioner stage. The spatial rate of decay of the reflection signal along both tethers of each SiBAR was measured, with at least two data sets per tether. To minimize any effect of positioning error, scans were started 5 μm before the root of the tether (on the body of the resonator) and moved toward the anchors. Scans were automated and the positioner stage moved in steps of ~30 nm. Feedback control was implemented to maintain the root mean square (RMS) position error of the stage to under ±2 nm per step. The reflection amplitudes measured at the network analyzer are proportional to the actual strain. FIG. 20 shows an exemplary reflection of the laser from the micromechanical resonator, and FIG. 21 shows reflection amplitude profiles and strain mode shapes. FIG. 22 shows a 3-period PnC tether SiBAR with the scan directions indicated, and the measured profiles along both tethers.

Figure 23:
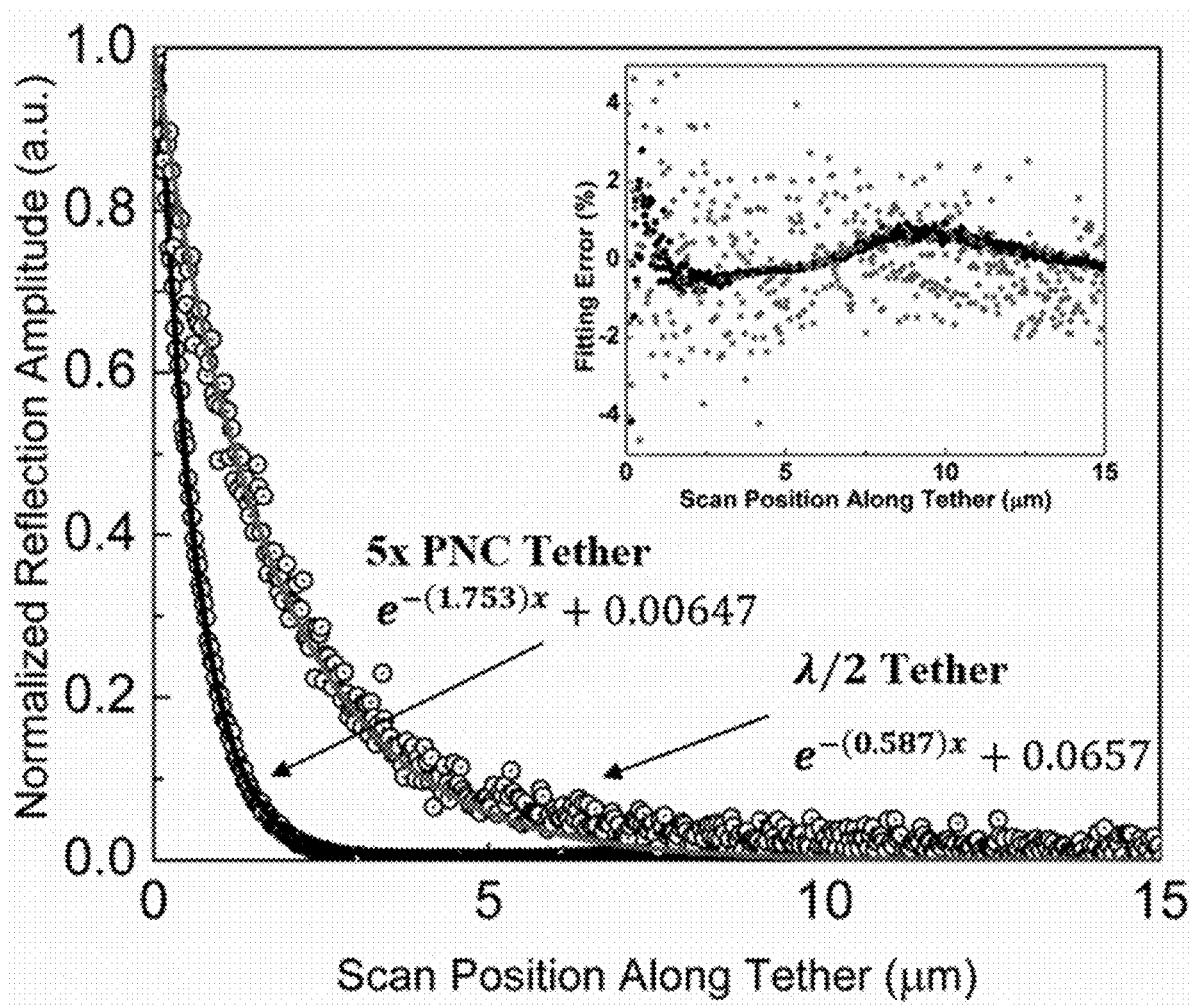
FIG. 23 shows a graph of normalized reflection amplitude versus scan position along tether for tether profiles (normalized to full span of each data set) and best-fit exponential curves of a form $(y/y_0 = e^{-\beta x} + c)$ for tether designs of a λ/2 beam tether and a 5-period PnC tether, wherein values of β are in $\mu m^{-1}$, and the inset shows fitting error that was less than 5%.

Each dataset has been fitted to an exponential curve of the form $y/y_0=e^{-\beta x}+c$, using a robust least squares algorithm, where $\beta$ ($\mu m^{-1}$) is the spatial rate of decay. The fitting algorithm searches for the minimum residual fitting error and optimizes starting position and size of a sliding data window to eliminate potential positioning offset errors. FIG. 23 shows two extreme tether strain profiles and best-fit exponential curves. For the purposes of comparison, each data set is normalized to span the full scale between the maximum value at the root of the tether and the minimum value at the system noise floor. The comparison clearly shows the sharp decay for the 5-period PnC tether (Q=36,985) in contrast to the slow decay for the $\lambda/2$ beam tether (Q=3,690).

Figure 24:
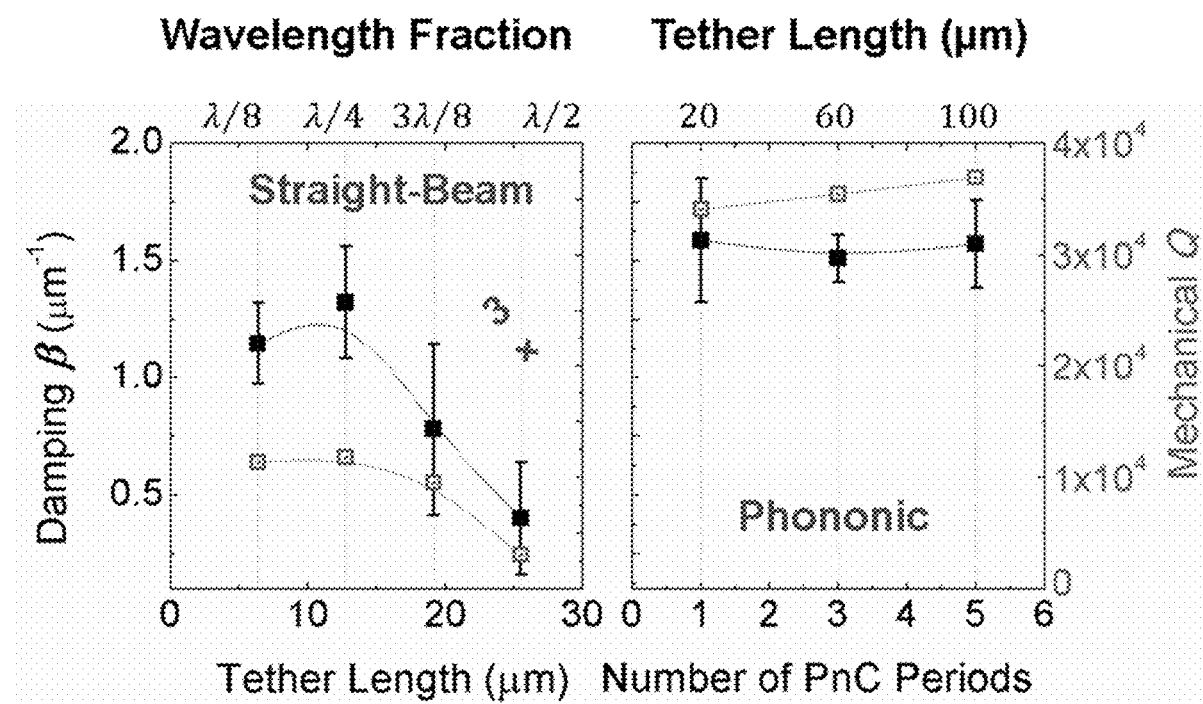
FIG. 24 shows a graph of damping versus tether length in panel A and a graph of mechanical Q versus number of PnC periods in panel B, wherein measured Q (open squares) and best-fit β (closed squares) of straight and PnC tethers had values of β that were averages of 4 data-sets each (two per tether); error bars show one standard deviation.

Measured values of mechanical Q and the best-fit values of $\beta$ are plotted in FIG. 24 as a function of the tether design (length or number of periods). For the conventional straight tethers, the relation between length of the tether and the acoustic wavelength is critical, with the $\lambda/4$ tether significantly outperforming the $\lambda/2$ tether. This experimentally verifies established results based on transmission theory for acoustic/electromagnetic waves. At the same time, we see that the 1-D PnC tethers outperform even the $\lambda/4$ tethers significantly, yielding higher Q and sharper damping curves.

For an infinite chain of PnC units, perfect isolation could occur with an abrupt drop in strain level at the root of the tether. In a finite PnC chain, sharp, not abrupt changes in strain levels occur. As the number of unit cells was increased (which better approximates an infinite phononic crystal), better performance occurs for the tether. Increase in Q due to better tether design can be suppressed by phonon damping as shown in FIG. 28.

One-dimensional PnC tethers for single-material SiBARs improved mechanical Q over conventional straight beam tethers. The scanning strain measurement technique here provided spatially resolved visualization of in-plane dynamics of MEMS resonators and supporting tethers and anchors that cannot be provided by aggregate measurements of electrical parameters. The scanning strain measurement measured tether loss profiles directly and independently and correlated properties of tether designs to mechanical Q of the resonator.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A micromechanical vibrasolator to isolate vibration of a micromechanical resonator, the micromechanical vibrasolator comprising:
the micromechanical resonator comprising a vibrational resonance frequency and in-plane vibrational mode at the vibrational resonance frequency;
a first phononic bandgap mirror in acoustic communication with the micromechanical resonator and disposed on the micromechanical resonator, the first phononic bandgap mirror comprising:

a plurality of monophones, each monophone being connected serially in acoustic communication with an adjacent monophone; and a plurality of phonophore arms in acoustic communication with the monophones, such that adjacent monophones are interconnected by a phonophore arm and interposed between a pair of phonophore arms to provide an alternating sequence of phonophore arm-monophone-phonophore arm, the alternating sequence being repeated a plurality of times in the first phononic bandgap mirror and providing a first acoustic bandgap at the vibrational resonance frequency of the micromechanical resonator, such that the first phononic bandgap mirror is disposed on the micromechanical resonator by at least one of the phonophore arms;

a first abutment in acoustic communication with the first phononic bandgap mirror and disposed on the first phononic bandgap mirror, the first phononic bandgap mirror being interposed between the first abutment and the micromechanical resonator such that, the vibrational resonance frequency from the micromechanical resonator is blocked from being received by the first abutment by the first acoustic bandgap of the first phononic bandgap mirror;

a second phononic bandgap mirror in acoustic communication with the micromechanical resonator and disposed on the micromechanical resonator, the second phononic bandgap mirror comprising:

a plurality of monophones, each monophone being connected serially in acoustic communication with an adjacent monophone; and a plurality of phonophore arms in acoustic communication with the monophones, such that adjacent monophones are interconnected by a phonophore arm and interposed between a pair of phonophore arms to provide an alternating sequence of phonophore arm-monophone-phonophore arm, the alternating sequence being repeated a plurality of times in the second phononic bandgap mirror to provide a second acoustic bandgap, such that the second phononic bandgap mirror is disposed on the micromechanical resonator by at least one of the phonophore arms in the second phononic bandgap mirror;

a second abutment in acoustic communication with the second phononic bandgap mirror and disposed on the second phononic bandgap mirror, the second phononic bandgap mirror being interposed between the second abutment and the micromechanical resonator such that the vibrational resonance frequency from the micromechanical resonator is blocked from being received by the second abutment by the second acoustic bandgap of the second phononic bandgap mirror; and further comprising an actuator in electrostatic communication with the micromechanical resonator and that:

electrostatically interacts with the micromechanical resonator; and electrostatically excites the vibration resonance frequency of the micromechanical resonator such that the micromechanical resonator vibrates of the micromechanical resonator such that the micromechanical resonator vibrates in the in-plane vibrational mode, wherein the micromechanical resonator is interposed between the first phononic bandgap mirror and the second phononic bandgap mirror;

the first phononic bandgap mirror and the second phononic bandgap mirror on opposing sides of the micromechanical resonator, and the first phononic bandgap mirror and second phononic bandgap mirror are arranged perpendicular to a direction of vibration of the in-plane vibrational mode of the micromechanical resonator.

2. The micromechanical vibrasolator of claim 1, further comprising a substrate on which the first abutment and the second abutment are disposed.

3. The micromechanical vibrasolator of claim 2, further comprising a resonator gap interposed between the substrate and the first phononic bandgap mirror, the micromechanical resonator, and the second phononic bandgap mirror, wherein the micromechanical resonator is spaced apart from the substrate by the resonator gap, and the first abutment and the second abutment suspend the first phononic bandgap mirror, the micromechanical resonator, and the second phononic bandgap mirror off of substrate by the resonator gap.

4. The micromechanical vibrasolator of claim 3, further comprising a support disposed on the substrate, wherein the support is interposed between the first abutment and the substrate, and the support is interposed between the second abutment and the substrate.

5. The micromechanical vibrasolator of claim 2, further comprising a junction support disposed on the substrate, and interposed between the substrate and the first phononic bandgap mirror or the second phononic bandgap mirror and that supports the first phononic bandgap minor or the second phononic bandgap mirror from the substrate.

6. The micromechanical vibrasolator of claim 1, wherein a number of monophones in the first phononic bandgap mirror is identical to a number of monophones in the second phononic bandgap minor.

7. The micromechanical vibrasolator of claim 1, wherein a number of monophones in the first phononic bandgap mirror is different than a number of monophones in the second phononic bandgap mirror.

8. The micromechanical vibrasolator of claim 1, wherein monophones in the first phononic bandgap mirror have identical cross-sectional shapes.

9. The micromechanical vibrasolator of claim 1, wherein at least one of the monophones in the first phononic bandgap mirror has a cross-sectional shape that is different than at least one of a remainder of the monophones in the first phononic bandgap mirror.

10. The micromechanical vibrasolator of claim 1, wherein monophones in the first phononic bandgap mirror have identical cross-sectional shapes as the monophones in the second phononic bandgap mirror.

11. The micromechanical vibrasolator of claim 1, wherein a cross-sectional shape of the monophones in the first phononic bandgap mirror in a plane parallel to the in-plane vibrational mode of the micromechanical resonator comprises a polygon, a circle, or an ellipse.

12. The micromechanical vibrasolator of claim 11, wherein the cross-sectional shape is the polygon, and the polygon comprises a square.

13. The micromechanical vibrasolator of claim 1, wherein a cross-sectional shape of the monophones in the second phononic bandgap mirror in a plane parallel to the in-plane vibrational mode of the micromechanical resonator comprises a polygon, a circle, or an ellipse.

14. The micromechanical vibrasolator of claim 13, wherein the cross-sectional shape is the polygon, and the polygon comprises a square.

15. The micromechanical vibrasolator of claim 1, wherein a shape of the monophones in the first phononic bandgap mirror and a shape of the monophones in the second phononic bandgap mirror are a cube.

16. The micromechanical vibrasolator of claim 1, wherein monophones in the first phononic bandgap mirror comprise a homogenous material in a direction perpendicular to a direction of the in-plane vibrational mode of the micromechanical resonator.

17. The micromechanical vibrasolator of claim 1, wherein monophones in the first phononic bandgap mirror comprise a heterogenous material in a direction perpendicular to a direction of the in-plane vibrational mode of the micromechanical resonator.

18. The micromechanical vibrasolator of claim 1, wherein monophones in the first phononic bandgap mirror comprise a material that is different than a material of the phonophore arms.

* * * * *